(12) United States Patent
Tracewell et al.

(10) Patent No.: US 7,111,853 B2
(45) Date of Patent: Sep. 26, 2006

(54) TRANSPORTABLE CONTAINER FOR ELECTRICAL DEVICES

(75) Inventors: Matt S. Tracewell, Powell, OH (US); Luke J. Eichhorn, Gahanna, OH (US)

(73) Assignee: Tracewell Systems, Inc., Columbus, OH (US)

( * ) Notice: Subject to any disclaimer, the term of this patent is extended or adjusted under 35 U.S.C. 154(b) by 109 days.

(21) Appl. No.: 10/942,474

(22) Filed: Sep. 16, 2004

(65) Prior Publication Data
US 2006/0055135 A1    Mar. 16, 2006

(51) Int. Cl.
*B62B 1/00* (2006.01)

(52) U.S. Cl. .................... 280/79.2; 280/47.35

(58) Field of Classification Search ........... 280/79.2, 280/79.3, 79.4, 79.7, 47.35, 47.28, 47.29, 280/47.26; 312/265.1, 334.44, 223.2, 223.6, 312/350; 219/201, 385
See application file for complete search history.

(56) References Cited

U.S. PATENT DOCUMENTS

| | | | | |
|---|---|---|---|---|
| 3,751,629 A | * | 8/1973 | Eisler | 219/201 |
| 4,616,890 A | * | 10/1986 | Romick | 312/265.1 |
| 4,666,221 A | * | 5/1987 | Ernst | 312/334.18 |
| 4,681,378 A | * | 7/1987 | Hellman, III | 312/223.2 |
| 5,219,443 A | * | 6/1993 | Stoerk et al. | 312/223.6 |
| 5,383,722 A | * | 1/1995 | Chen | 312/334.44 |
| 5,853,237 A | * | 12/1998 | Powell et al. | 312/263 |
| 6,378,963 B1 | * | 4/2002 | Relyea et al. | 312/219 |
| 6,688,615 B1 | * | 2/2004 | Chen | 280/47.35 |
| 6,692,011 B1 | * | 2/2004 | Carlson et al. | 280/79.2 |
| 2002/0105252 A1 | * | 8/2002 | Dorman | 312/350 |
| 2005/0062238 A1 | * | 3/2005 | Broadfield et al. | 280/1 |
| 2006/0006621 A1 | * | 1/2006 | Santa Cruz et al. | 280/79.3 |

* cited by examiner

*Primary Examiner*—Hau Phan
(74) *Attorney, Agent, or Firm*—Mueller and Smith, LPA

(57) ABSTRACT

A transportable container for electrical devices having aluminum bottom, top and end panels. The top and bottom panels are configured having spaced apart interior and exterior sheet members laser welded to a corrugate stiffener. Each end panel is structured with an exterior sheet member spaced from an interior plurality of drawer guides laser welded to a corrugate stiffener. A plurality of aluminum drawers are mounted upon the drawer guides, each having an air entrance opening at its back communicating with air transfer outlets at a fan charged air distribution plenum. Conditioned a. c. power is provided at receptacles within each drawer as well as LAN connectors.

71 Claims, 19 Drawing Sheets

TRANSPORTABLE CONTAINER FOR ELECTRICAL DEVICES

BACKGROUND OF THE INVENTION

As systems such as aircraft both commercial and military have evolved, their technical complexity has advanced exponentially. In concert with such technical advancement the logistics associated with their maintenance, upgrading and repair has required the development of extensive information which traditionally has been generated in the form of paper carried printed text and drawings. The bulk of that paper text, sometimes referred to as "technical orders" (TO) can be substantial, paper technical orders for a complex military aircraft typically requiring palletizing for its transport. As a consequence of this information growth, industry and government have or are in the process of converting this extensive paper carried information into an electronic data collection manifested in technician carried laptop computers, personal data assistance (PDAs) and the like.

Accordingly, logistic concerns now have turned to the management of an extensive number of these portable electronic data devices. For instance, each one of a modern military fighter aircraft typically will require about three laptop computers with associated battery chargers and local area network (LAN) coupling capabilities for receiving TO upgrades and downloading maintenance data. Such logistical support components will be co-deployed with an extra base deployment of their corresponding aircraft. Often at a given base to which the aircraft are assigned, a collection of many laptop computers will be observed on the tops of tables connected with battery chargers, connected in turn to a. c. strip outlets, LANs and the like, a logistic management approach deemed less than desirable. Deployment of this equipment, for instance, to foreign bases requires some form of containment for shipping. Fiberglass transit cases capable of being lifted by two to four men have been available for this purposes. Suggestion has been made to retrofit these hard tooled cases with metal shelving for carrying the equipment. The result of such retrofitting is an excessive case weight and a support approach exhibiting little system design flexibility. Shelf containing steel cases for carrying equipment have been marketed. However, such containment also exhibits excessive weight.

BRIEF SUMMARY OF THE INVENTION

The present invention is addressed to a transportable container for electrical devices such as laptop computers, personal data assistant (PDA) spare rechargeable batteries and the like. Having top, bottom and side panels defining a containment region configured with aluminum outer surfaces mated with a corrugate aluminum stiffener, the containers are advantageously lighter than retrofitted molded fiberglass reinforced transit cases. In part because the panels are assembled utilizing robotically guided laser welding procedures, no hard tooling is required for their assembly. Thus the design for the containers may be customized to meet specific use needs without encountering excessive retooling costs.

To retain and service compact electronic computer devices, the containers are configured with a plurality of generally vertically stacked sheet aluminum drawers mounted upon drawer guides. These drawer guides serve as an integral structural component of the side panels, being laser welded directly to the corrugate aluminum internal stiffeners. When in a closed orientation, the fronts and backs of the stacked drawers are aligned in close mutual adjacency such that when locked in place by a vertical locking assembly their contents are secured for transit and against tampering. The closed orientation also provides for servicing the electronic computer devices and the like. When the drawers are in their closed orientation the stacked drawer backs extend to a rearwardly disposed service region within the containment region.

Within the servicing region there is mounted an electric power conditioning assembly having power treatment components connectable with an external source of line power and deriving an intermediate output or bus at a d.c. level. An inverter responds to that d.c. level to synthesize a very reliable conditioned a.c. waveform within a U. S. range of voltage and frequency. That conditioned a.c. output is distributed to a.c. receptacles mounted within each drawer. With this arrangement, the recharging lines of laptop computers, rechargeable spare batteries and the like can be charged while remaining protected within the drawers. The power treatment components include electromagnetic interference filtering (EMI), transient suppression and inrush current limiting features. Additionally the filtered line input is introduced to a power factor correcting (PFC) a.c. to d.c. power supply or converter which derives and isolates the d.c. bus or d.c. voltage level or interim level while also creating a sinusoidal current waveform which matches the sinusoidal input voltage waveform. This provides a for high power factor to reduce line current harmonics. The provision of the power factor correction feature derives a variety of beneficial attributes. Less current is drawn and the container may be employed universally with power utilities on a worldwide basis.

The interim d.c. bus is derived at 24 volts and thus, may be supplanted essentially directly by the 28 volt power supply of vehicles such as the military Humvee.

Additionally incorporated within the service region are local area network (LAN) or Ethernet switches powered from auxiliary a.c. receptacles also coupled with the conditioned a.c. output. From these hubs, LAN cables extend to each drawer with associated LAN connectors such that the drawer containing computer devices may be uploaded and downloaded with upgrades and maintenance data while retained overnight in a secure environment. Cable management of the LAN and power distribution lines is simply achieved with utilization of a ribbon form of cabling extensible into and out of horizontal channels associated with the interior drawer guides.

Heat loads associated with the device servicing activities are accommodated for by vertically oriented air distributing plenums mounted at the support region. These manifolds are configured with a vertical sequence of air transfer outlets, each located for air transfer communication with a drawer. In the latter regard, each of the aluminum drawers is formed with a corresponding air entrance opening at its drawer back and an array of air transfer openings at its drawer front. The plenums are charged with air under pressure by high pressure fans. Thus, when the drawers are in their closed orientation a forced air pathway is produced extending from the drawer, back across the serviced device and through the drawer front. Inasmuch as the drawers are formed of thermally conductive aluminum, a heat sink form of thermal averaging amongst the drawer components is realized. In general two plenums service fourteen drawers and are configured such that a metered or substantially constant air flow is expressed through the plenum air transfer outlets. This consistency, inter alia, permits temperature monitoring along with safety and fan speed control to be based upon the temperature of incoming ambient fan driven air and the electrical load witnessed at the inverter.

The front and back edge peripheries of the containers may be enclosed utilizing very light aluminum honeycomb stiffened panels in conjunction with over-center latches. Protection of the outer aluminum surfaces of these front and back panels as well as the exterior aluminum surfaces of the containers is provided by a somewhat thick polyurethane coating such as that commercially employed to protect pick-up truck beds and the like.

During transit, the computer devices and the like are retained within the drawers by cleat tie downs to cooperate with an array of tie down openings within each drawer floor. Velcro strapping may be made available. The containers may be stacked one upon the other through the utilization of interlocking skid plates mounted upon the top panel and bottom panel. Further, the support region of each container carries removable wheeled casters for mounting at the bottom panel located skid plates.

Other objects of the invention will, in part, be obvious and will, in part, appear hereinafter. The invention, accordingly, comprises the apparatus possessing the construction, combination of elements and arrangement of parts which are exemplified in the following description.

For a fuller understanding of the nature and abject of the invention, reference should be had to the following detailed description taken in connection with the accompanying drawings

BRIEF DSCRIPTION OF THE DRAWINGS

Figure 17A:
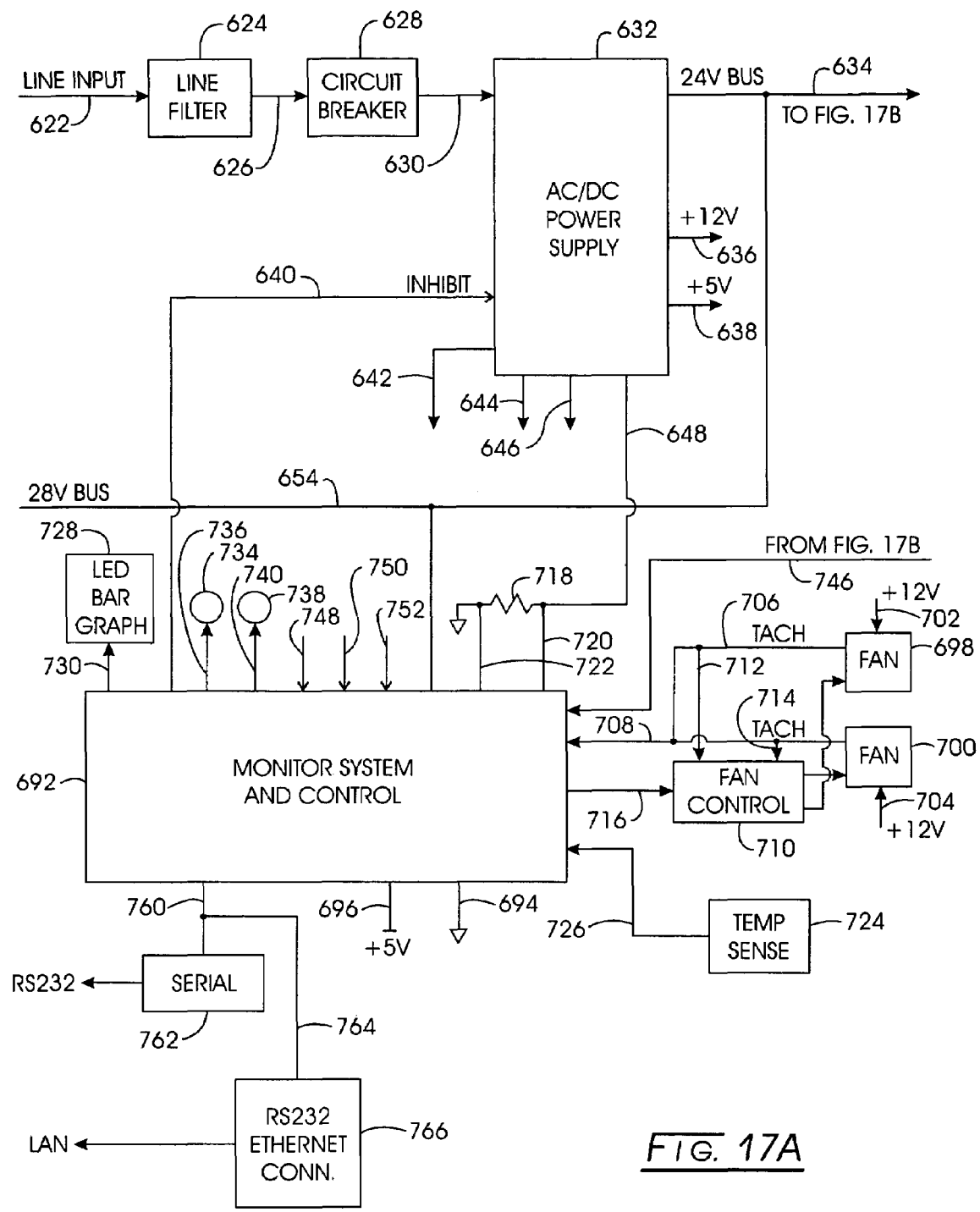
Figure 17B:
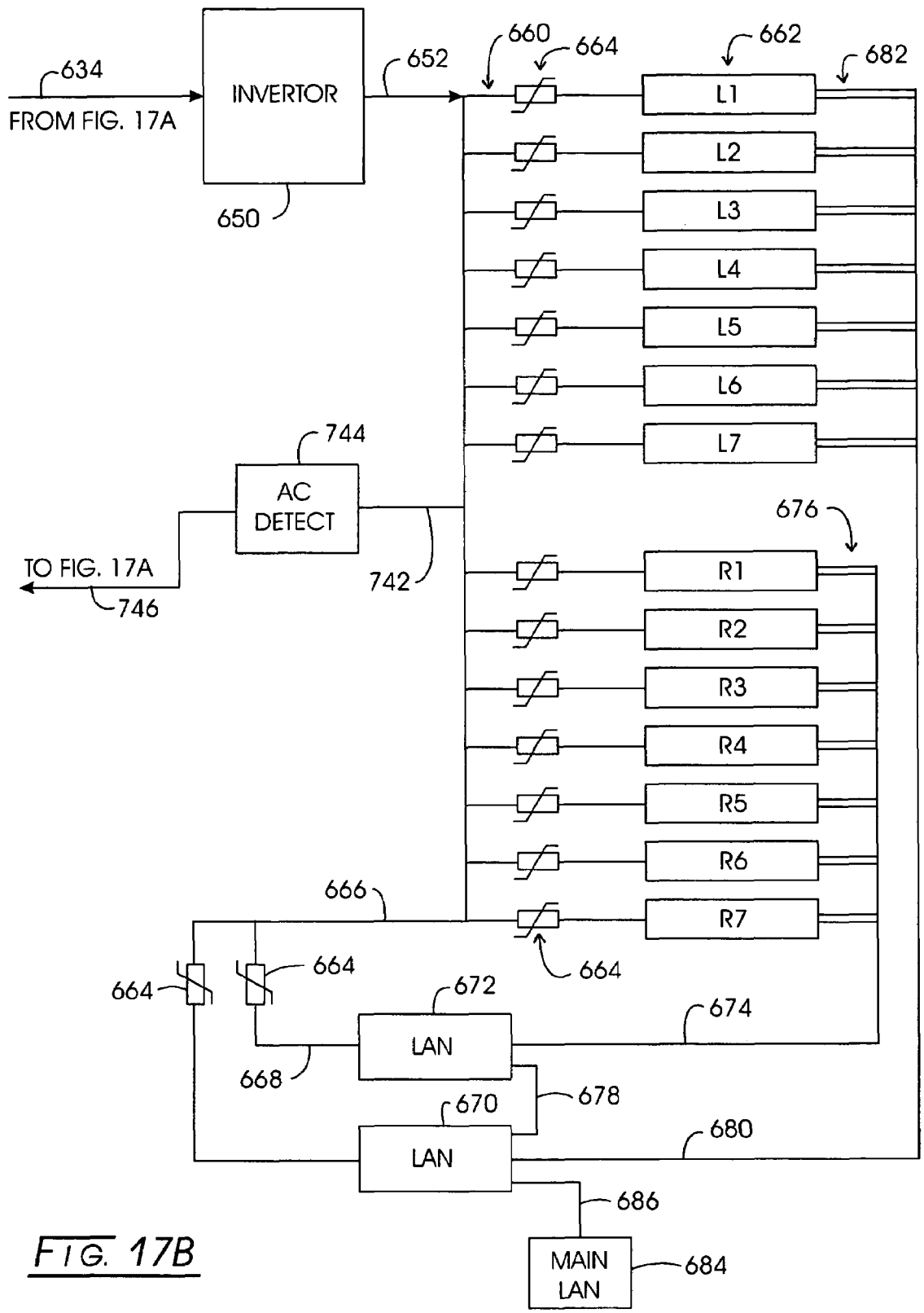
Figure 18:
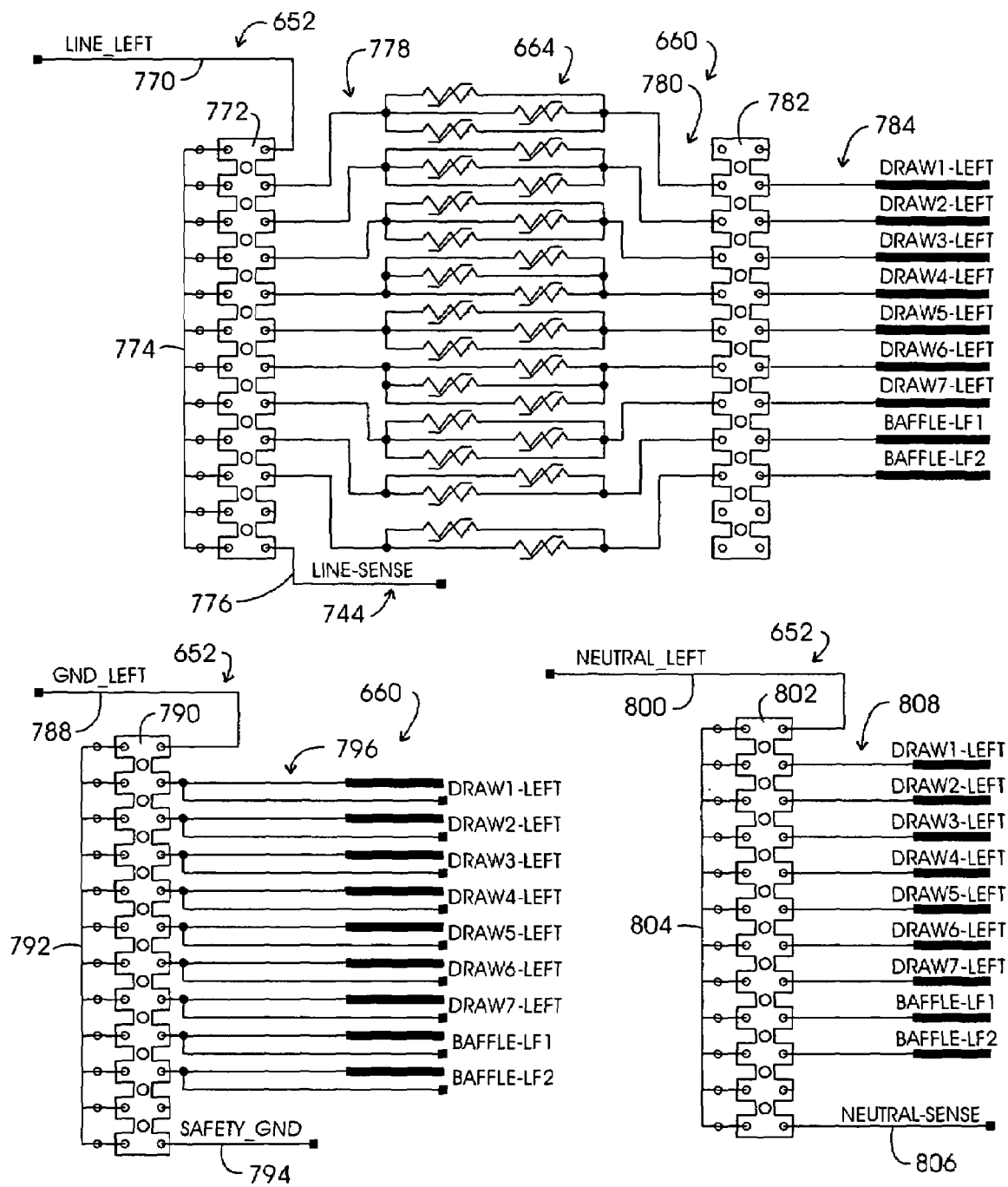
Figure 19:
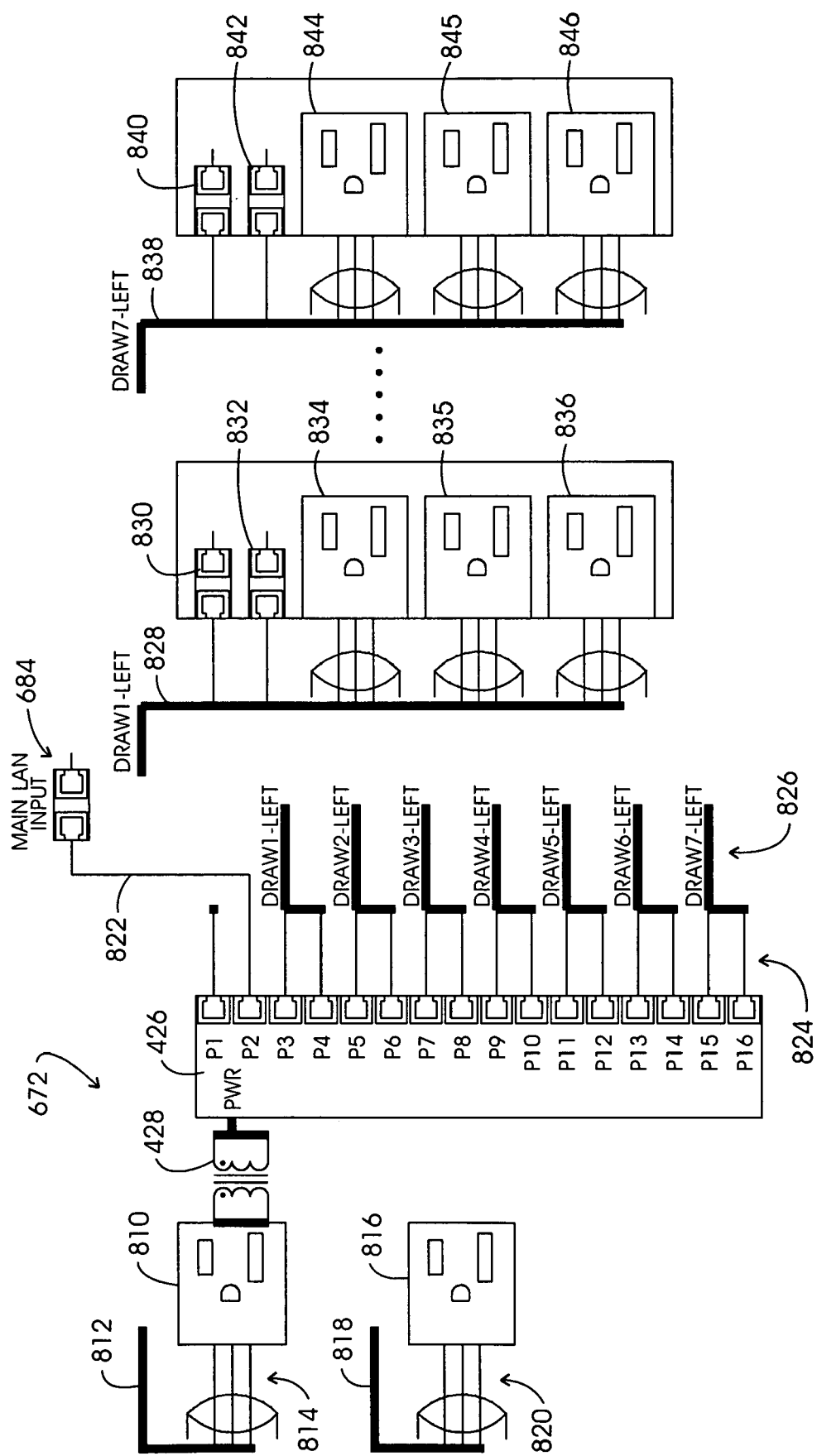

FIGS. 17A and 17B combine as labeled thereon to provide a block diagram of the electrical components retained in the transportable container of the invention;

FIG. 18 is a power wiring diagram for the left side drawers of the transportable container of the invention; and FIG. 19 is a wiring diagram for the left side drawers of the transportable container of the invention showing LAN distribution and a combination of LAN, and power distribution to left side drawers

DETAILED DESCRIPTION OF THE INVENTION

In the discourse to follow, the general structure and architecture of the transportable containers of the invention are addressed. In this regard, structural rigidity is achieved in combination with relatively low weight. Next, the discussion turns from the transportable features to those features developing an effective cooling air system utilized while computer devices, batteries and the like are being serviced both in terms of recharging and in local area network (LAN) updating or reconfiguring. Finally, power conditioning and monitoring and control features are addressed.

Figure 1:
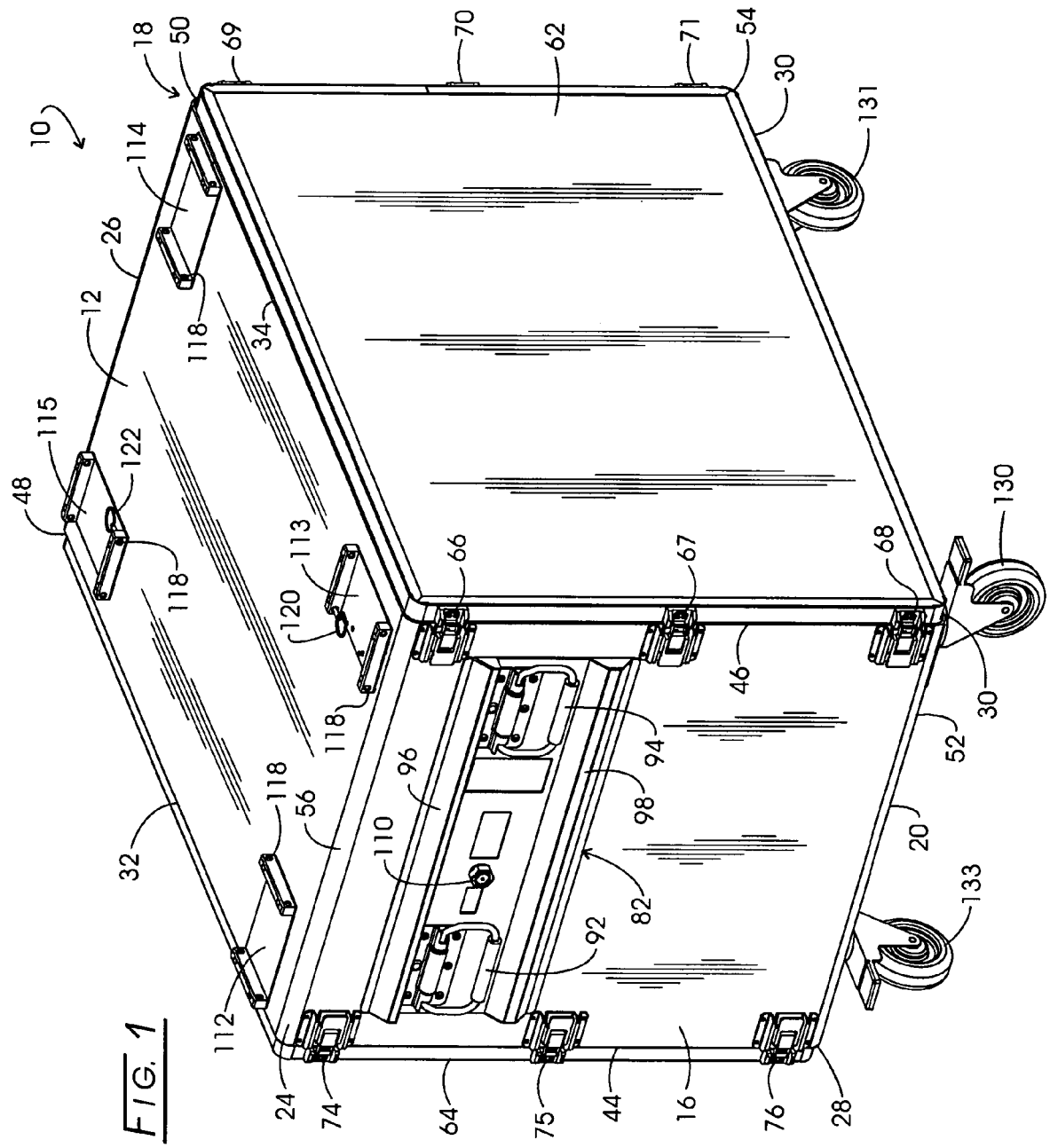
FIG. 1 is a perspective view of a transportable container according to the invention showing it secured with front and back panels.
Figure 3:
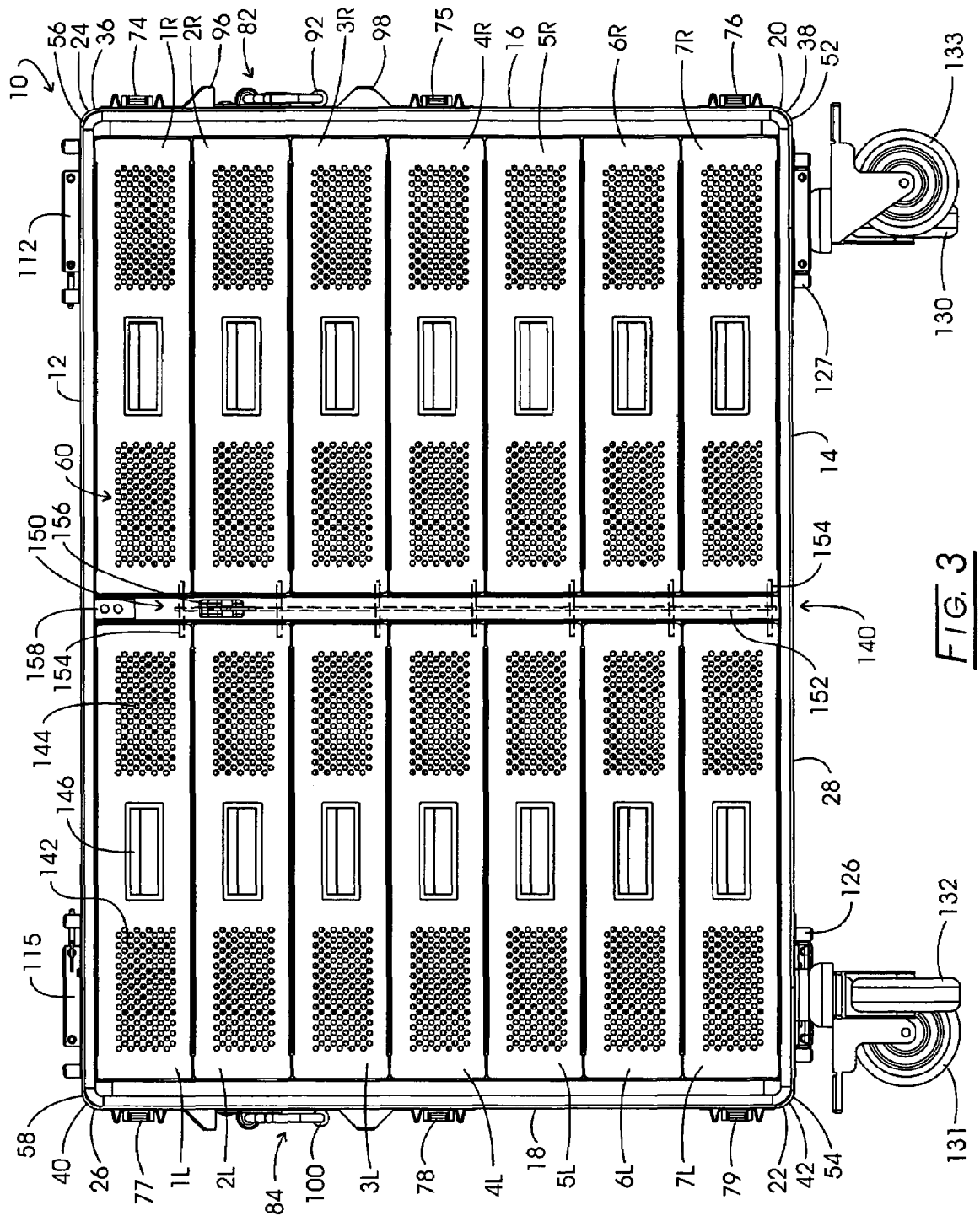
FIG. 3 is a front view of a transportable container according to the invention with the front and back panels removed.

Referring to FIG. 1, a transportable container configured in accordance with the invention is represented generally at 10. In its basic configuration, the container 10 is configured with rigid generally rectangular top and bottom panels seen additionally in FIG. 3 at 12 and 14. That figure also reveals that the top and bottom panels are coupled about their upper and lower edges with end panels 16 and 18. FIG. 3 reveals that bottom panel 14 exhibits a bottom panel length extending between oppositely disposed bottom side ends 20 and 22, while top panel 12 exhibits a corresponding top panel length extending between oppositely disposed top side ends 24 and 26. FIG. 1 further reveals that the bottom panel 14 exhibits a bottom panel width extending between oppositely disposed bottom length ends 28 and 30. Top panel 12 exhibits a top panel width corresponding with the bottom panel width extending between oppositely disposed length ends 32 and 34. FIG. 3 reveals that end panel 16 exhibits an end panel height extending between oppositely disposed top height edges 36 and 38, while end panel 18 exhibits an end panel height extending between oppositely disposed height edges 40 and 42 corresponding with the height edge of panel 16. FIG. 1 reveals that end panel 16 exhibits an end panel width extending between oppositely disposed width edges 44 and 46 corresponding with the bottom and top panel widths while the oppositely disposed end panel represented generally at 18 exhibits an end panel width extending between oppositely disposed width edges 48 and 50 which corresponds with the panel width of end panel 16. These figures further reveal that one height edge of end panel 16 is fixed to and extends normally upwardly from the bottom panel 14 to define a bottom corner 52. It may be observed that this bottom corner 52 is radiused. FIG. 3 reveals that one height edge of end panel 18 is fixed to and extends normally upwardly from bottom panel 14 to define a bottom corner 54. As before, note that bottom corner 54 is radiused. Correspondingly, FIG. 1 reveals that the top side end of top panel 12 is fixed to and extends normally from end panel 16 at the upwardly disposed height edge thereof to define a top corner 56. As seen in FIG. 3, the top side end of top panel 12 opposite top corner 56 is fixed to and extends normally from the upwardly disposed height edge of end panel 18 to define top corner 58. Note that top corner 58 is radiused. Thus configured, top panel 12, bottom panel 14, and associated end panels 16 and 18 define a containment region represented generally in FIG. 3 at 60 with generally rectangular front and back edge peripheries defined by bottom length ends, the top length ends and the end panel width edges. When the container 10 is to be transported, the containment region 60 is enclosed by rectangular back and front panels shown respectively at 62 and 64. Panels 62 and 64 are rigid and very light being formed of spaced apart aluminum metal sheets adhered to a conventional polymeric internal honeycomb stiffener. Each of the panels 62 and 64 are configured with an interiorly disposed peripheral gasket (not shown) so as to provide a seal for the containment region 60. Back and front panels 62 and 64 are each retained in position for transport by six over-center latches. In this regard, back panel 62 is retained by over-center latches 76–71 while as shown additionally in FIG. 3, front panel 64 is retained in position by over center latches 64–79.

Figure 11:
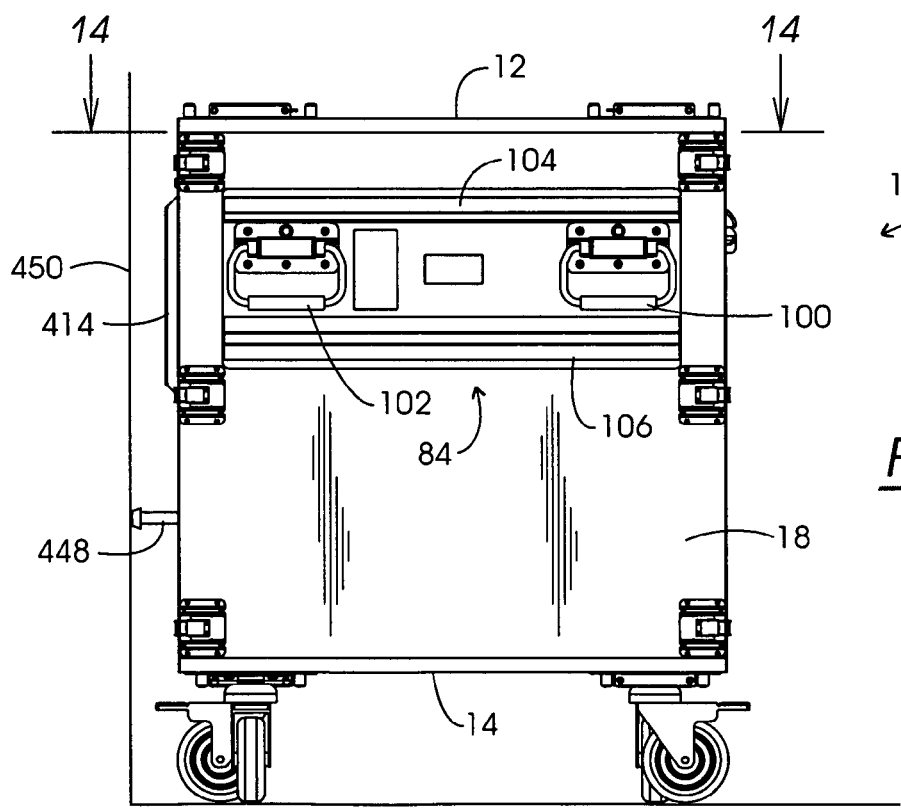
FIG. 11 is a left side view of the transportable container of FIG. 10.

When assembled for transport as shown in FIG. 1, container 10 will exhibit a weight which when loaded will permit it to be carried or maneuvered by up to four personnel. To facilitate this manual maneuvering, dual handle assemblies are provided. In this regard, dual handle assemblies are shown at 82 and 84 in FIG. 3. Looking momentarily to FIG. 1, handle assembly 82 is seen to be configured with pivotal handles 92 and 94, the physical integrity of which is maintained by protective crossbars 96 and 98. A similar dual handle assembly is provided at end panel 18. Looking momentarily to FIG. 11, that handle assembly is represented generally at 84 affixed to end panel 18. Assembly 84 is configured with pivotal handles 100 and 102 which, as before, are protected by crossbars as at 104 and 106.

Returning to FIG. 1, a pressure relief valve 110 mounted upon end panel 16 provides pressure relief communication with containment region 60 for providing protection thereto when the container 10 is transported. Note that the four corners of top panel 12 support four stacking cleats 112–115 each formed with spaced apart parallel engagement bars. Those engagement bars are uniquely oriented. In this regard the engagement bars of cleats 113 and 115 are arranged normally to the corresponding engagement bars of cleats 112 and 114. Note that each of these bars has a bore extending therethrough certain of which are represented at 118. These bores are intended to receive locking pins, two of which are represented at 120 and 122, in a storing orientation with respect to cleats 113 and 115. An oppositely oriented set of four skids or stacking cleats are mounted upon bottom panel 14. In this regard, FIG. 2 reveals stacking cleats or skids 124 and 125 adjacent rear panel 62, while FIG. 3 reveals stacking cleats or skids 126 and 127. Cleats 124–127 are configured such that their engagement bars will engage between the engagement bars of top panel cleats 112–115 such that the containers then may be stacked for shipment, storage or the like. The bottom panel mounted cleats 124–127 further are configured to support freely pivotal but lockable casters shown in FIGS. 2 and 3 at 130–133. Casters 130–133 will be seen to be removable and storable within containment region 60 for transport or storage purposes. To protect the outer surfaces of the panels during transportation or storage, they are coated with a layer of a spray-applied polyurethane. This coating has a multitude of more or less conventional uses, one being to protect the beds of pick-up trucks.

Figure 2:
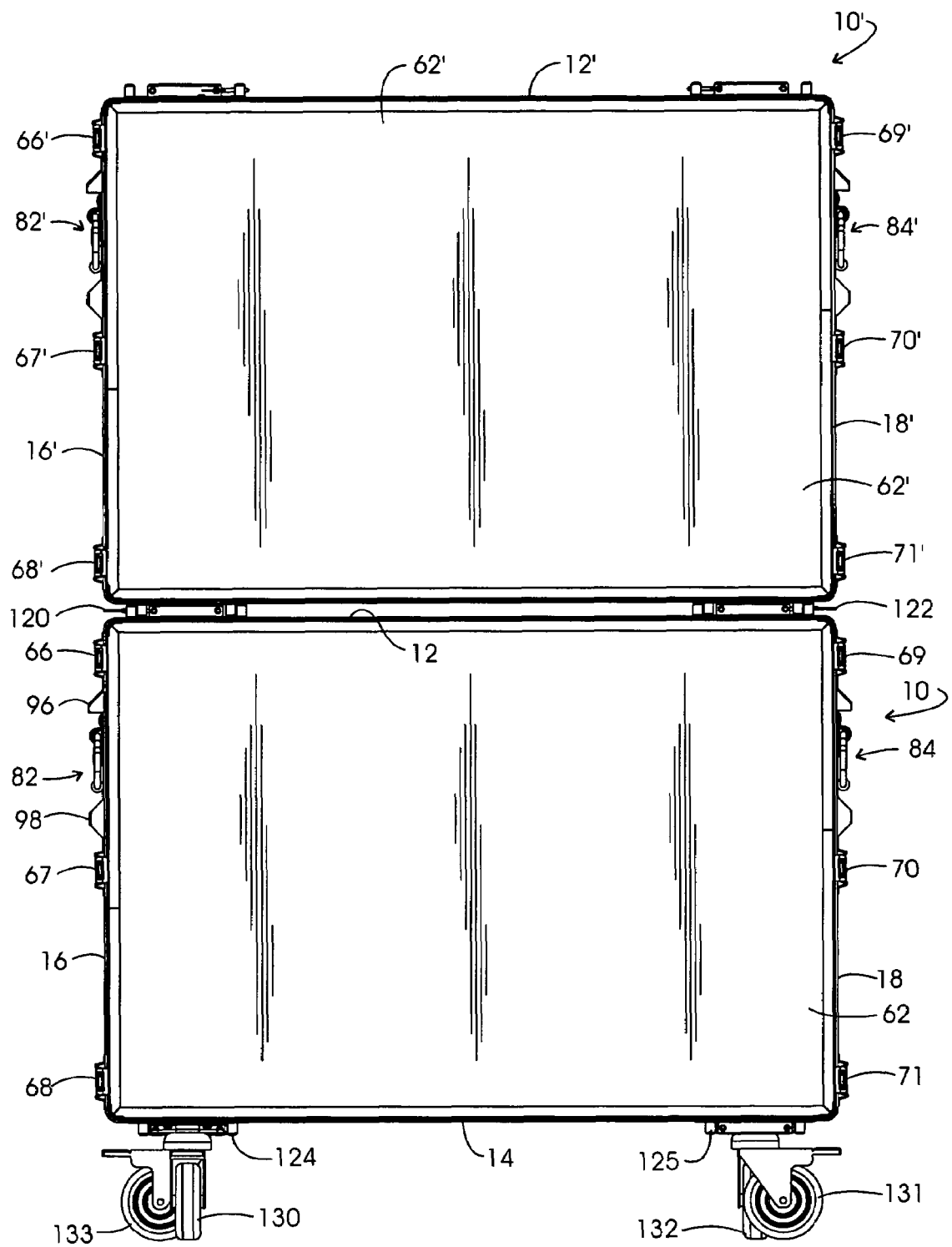
FIG. 2 is a side view of two stacked transportable containers according to the invention with front and back panels attached.

FIG. 2 reveals the stackability of containers as at 10. Container 10 reappears with the same component identifying numeration. Stacked upon the top panel 12 of container 10 is a container 10', the bottom panel mounted cleats thereof engaging the top panel cleats of container 10. Inasmuch as containers 10 and 10' are identical, the components of container 10' are identified with the same numeration as the components of container 10 but in primed fashion.

Figure 4:
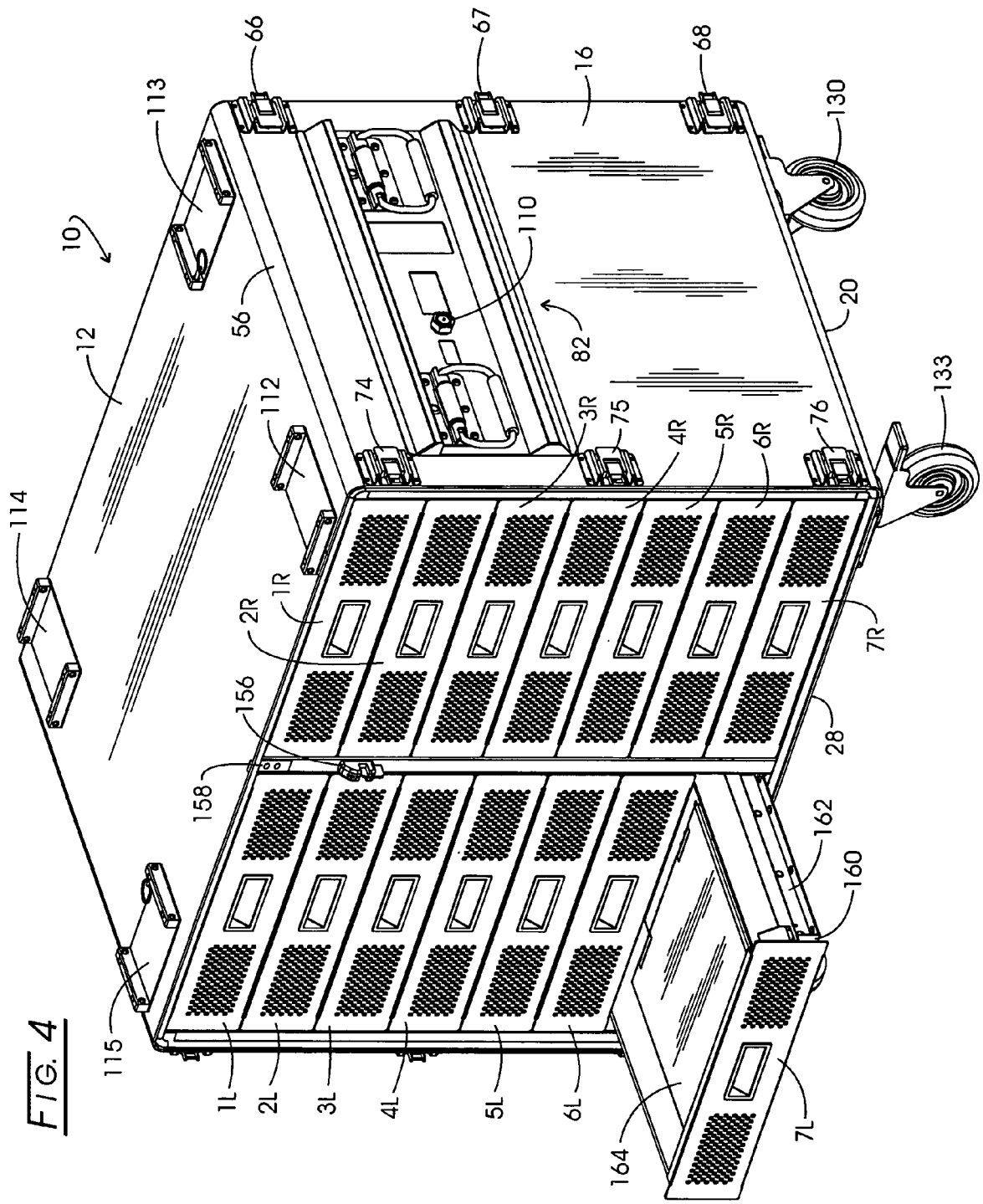
FIG. 4 is a perspective view of the transportable container of FIG. 3 showing a left side drawer in an open orientation.

FIG. 3 reveals the front of container 10 with the removal of front panel 64. Note that an internal support panel is present which is represented generally at 140. Panel 140 will be seen to have one side facing end panel 16 and configured to support seven drawers while the opposite side of panel 140 will face end panel 18 and be similarly configured to support drawers. For the instant embodiment, fourteen drawers are provided in two stacked vertical arrays. In this regard, drawers 1R–7R represent a right side stack, while drawers 1L–7L represent a left side stack. The fronts of these drawers are revealed in this figure in a closed orientation. Each drawer is formed of sheet aluminum and is configured with air transfer openings spaced on either side of the handle. In this regard, looking, for example, to drawer 1L, air transfer openings are seen at 142 and 144 spaced on either side of a drawer handle 146. Note that the openings 142 and 144 are configured as an array of relatively small apertures. Each of the drawer fronts as well as the drawer backs are configured such that when all are within the closed orientation shown, each drawer front and drawer back is closely spaced from an adjacent respective drawer front and drawer back. Thus, if the drawers are locked in place, no manual access is made available to their contents. To lock the drawers into place, a vertically oriented locking assemblage as represented generally at 150 is provided. Assemblage 150 is configured with a vertical locking bar assembly represented in phantom at 152 through which extends oppositely disposed lock pins certain of which are identified at 154. The upper region of locking bar 152 passes through a locking staple 156 such that when elevated, a padlock may be passed through the staple and blocking bar. Seen immediately above the staple 156 is a display 158 comprised of two tri-color light emitting diode (LED) assemblages. When locking bar assembly 152 is raised to a locking orientation, the locking pins 154 will move into a forward locking channel formed behind the front of the drawers. Such a locking channel is seen at 160 in FIG. 4 in connection with drawer 7L. Drawer 7L, as is the case with all of the drawers is configured with drawer glides formed of aluminum, one of which is shown at 162 in connection with drawer 7L. Drawer 7L also is seen having received a laptop computer 164.

Figure 5:
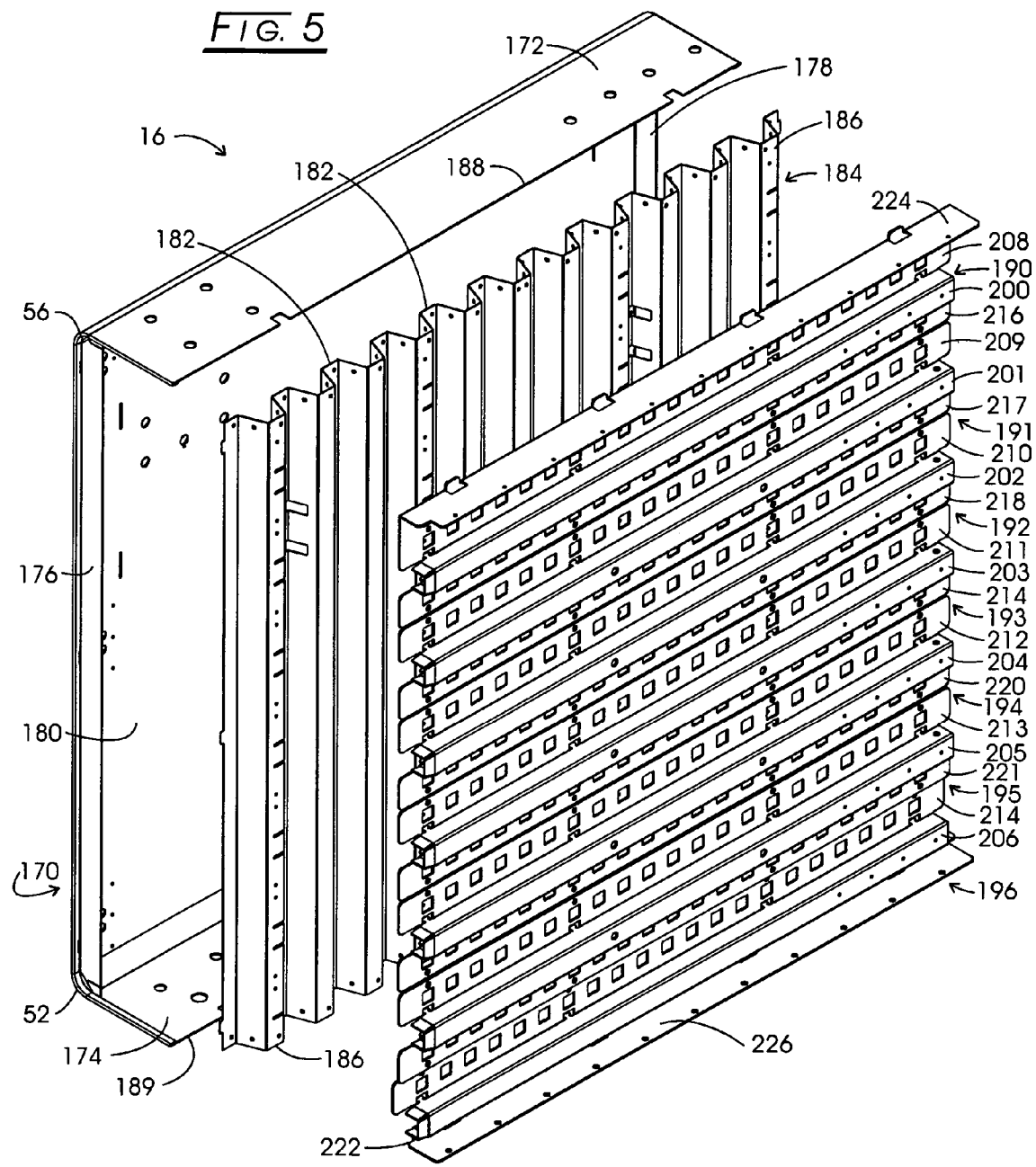
FIG. 5 is a perspective exploded view of one end panel according to the invention.

Each of the end panels 16 and 18 are essentially identically but mirror image configured as quite rigid composite aluminum structures. Looking to FIG. 5, end panel 16 is revealed in perspective and exploded fashion. These end panels as well as the top and bottom panels are fabricated without resort to hard tooling. In this regard, they may be built with a turret punch, a press break and a robotic arm carried laser welder. The latter welders, for example, utilizing YAG or carbon dioxide lasers are generally rated at about 4,000 watts for the instant utilization and function essentially to cut a slot without expelling the material of the slot. Accordingly, there is no requirement for holding two welded components together under pressure and heat generation which might otherwise cause heat induced warping of material is avoided. Accordingly, the components forming the panels are retained together utilizing a tab and slot preliminary assembly. In FIG. 5, end panel 16 is seen to be configured with an aluminum exterior sheet member represented generally at 170. Member 170 is generally C-shaped having integrally formed upper and lower flange portions shown respectively at 172 and 174. These flanges improve the connection of panels as at 16 with the top and bottom panels and also facilitate the formation of radiused corners 52 and 56. By so radiusing these corners utilization of peripheral gaskets in connection with the back and front cover 62 and 64 may be facilitated. Additionally, a stronger connection between the end panels and the top and bottom panels is realized. Extending interiorly between flange portions 172 and 174 and located at the lower periphery of sheet member 170 are sheet aluminum fillets 176 and 178. The interior surface 180 of sheet member 170 is laser welded to the valley portions as at 182 of a sheet aluminum corrugate stiffener represented generally at 184. Laser welded to the peak portions as at 186 of corrugate stiffener 184 is a sequence of seven horizontally disposed and parallel drawer guides 190–196. Each of the drawer guides in the vertical sequence 190–196 is configured with an outwardly depending channel portion shown respectively at 200–206 which slidably receive drawer glides as described at 162 in FIG. 4. Channels 200–206 are configured with integrally formed upwardly and downwardly depending flanges, the upper flanges being shown respectively at 208–214 and the downward flanges being shown respectively at 216–222. Uppermost drawer guide 190 further is configured with a horizontally disposed connector flange 224 which is laser welded to the underside of top panel 12. Similarly, drawer guide 196 is configured with a connector flange 226 which is laser welded to the interior side of bottom panel 14. Laser welding of the drawer guides 190–196 to the peak portions 186 of stiffener 184 is provided at the upward flanges 208–214 and downward flanges 216–222. It may be observed that with this design, the drawer guides 190–196 serve not only as drawer guides but become an integral component of the end panel structures thus saving weight and space. Additionally, inasmuch as the channel portions 200–206 are oriented horizontally and thus transversely to the vertical orientation of the peaks and valleys of stiffener 184, a second stiffening structural feature is realized. The oppositely disposed troughs defined by the peaks and valleys of the stiffener 184 additionally may be employed for support system purposes. For example, they may be utilized as races for receiving wiring or as conduits for delivering airflows to specific locations within the containment region 60.

Figure 6:
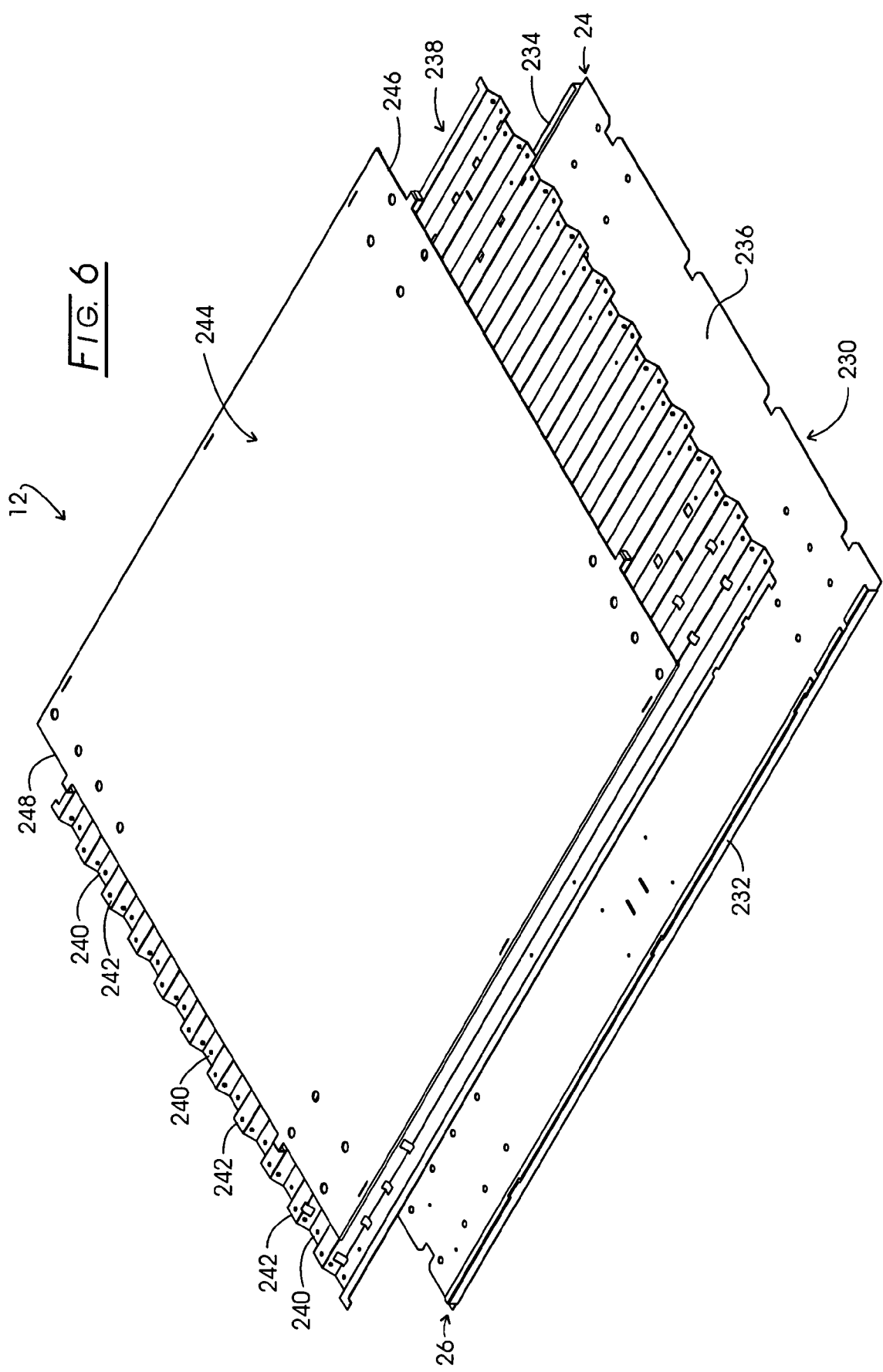
FIG. 6 is an exploded perspective view of a top panel according to the invention.
Figure 16:
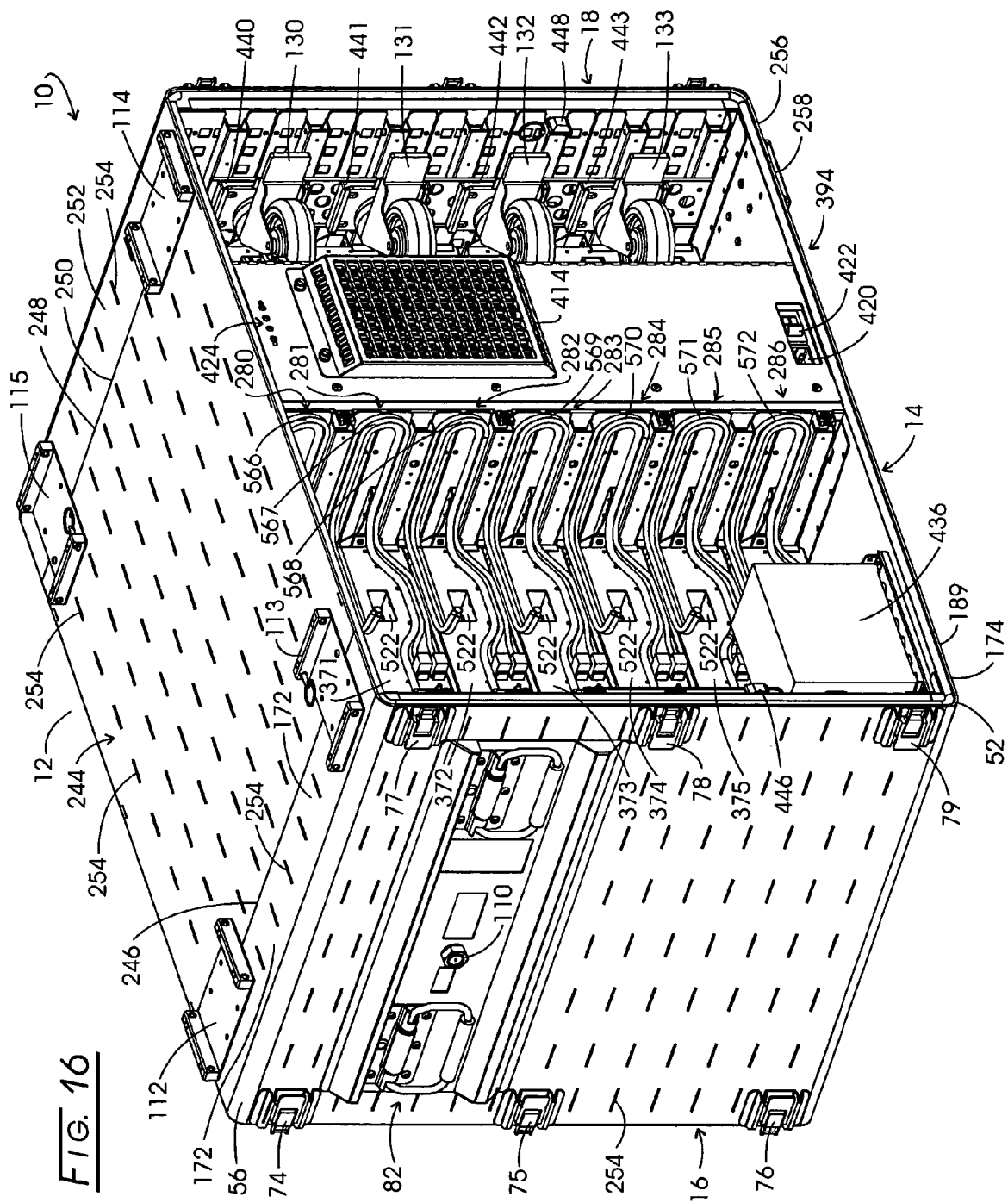
FIG. 16 is a perspective view of the transportable container of the invention showing rearward components with a left plenum removed, the storage of casters and weld stitches.

As in the case of the end panels, the upper and lower panels 12 and 14 are formed as compound aluminum metal structures configured with generally parallel spaced apart interior and exterior sheet members connected with the peak and valley portions of a sheet aluminum corrugate stiffener. Inasmuch as the top and bottom panels are quite similar, only top panel 12 is described. Looking to FIG. 6, a perspective, exploded view of top panel 12 is illustrated. The interior aluminum sheet metal member of panel 12 is shown generally at 230. Member 230 is configured with integrally formed upwardly extending fillet portions 232 and 234. The upwardly disposed surface 236 of interior member 230 is connected by laser welding to a sheet aluminum corrugate stiffener represented generally at 238 structured similarly to stiffener 184 described at in FIG. 5. Stiffener 238 is configured with valley portions certain of which are shown at 240 and integrally formed peak portions certain of which are illustrated at 242. As is apparent, the valley portions 240 are laser welded to surface 236 of sheet metal member 230. In general, interior sheet metal member 230 as well as stiffener 238 extend between top side ends 24–26. Connected by laser welding to the peak portions 242 of stiffener 238 is an exterior aluminum sheet metal member 244. Member 244 is of generally rectangular configuration and extends along the widthwise extent of stiffener 238 but in a lengthwise sense between exterior member edges 246 and 248. Edges 246 and 248 are recessed inwardly from respective top side ends 24 and 26, a distance corresponding with the widths of the upper flange portions as at 172 of the end panels as at 16 described in FIG. 5. For instance, the flange edge 188 of flange portion 172 will abut against edge 246 and its underside will be connected by laser welding to the peaks 242 of stiffener 238. As noted above, this promotes structural robustness without weight addition and facilitates the provision of radiusing at the corners of the container 10. Looking additionally to FIG. 16, the corresponding edge 250 of flange portion 252 of end panel 18 will abut against edge 248 and the interior side thereof will be connected by laser welding to the peaks 242 of stiffener 238. FIG. 16 illustrates the container 10 without the earlier-described polyurethane coating. Thus, laser weld stitches are revealed, certain of which are identified at 254.

Bottom panel 14 is configured in essentially the same fashion, accommodation being made for differently sized skids and the removable attachment of casters 130–133. FIG. 16 also reveals lower flange portion 174 of external sheet member 170 extending to its edge 189. A similar lower flange portion is seen in the figure at 256 extending to an edge 258.

Figure 7:
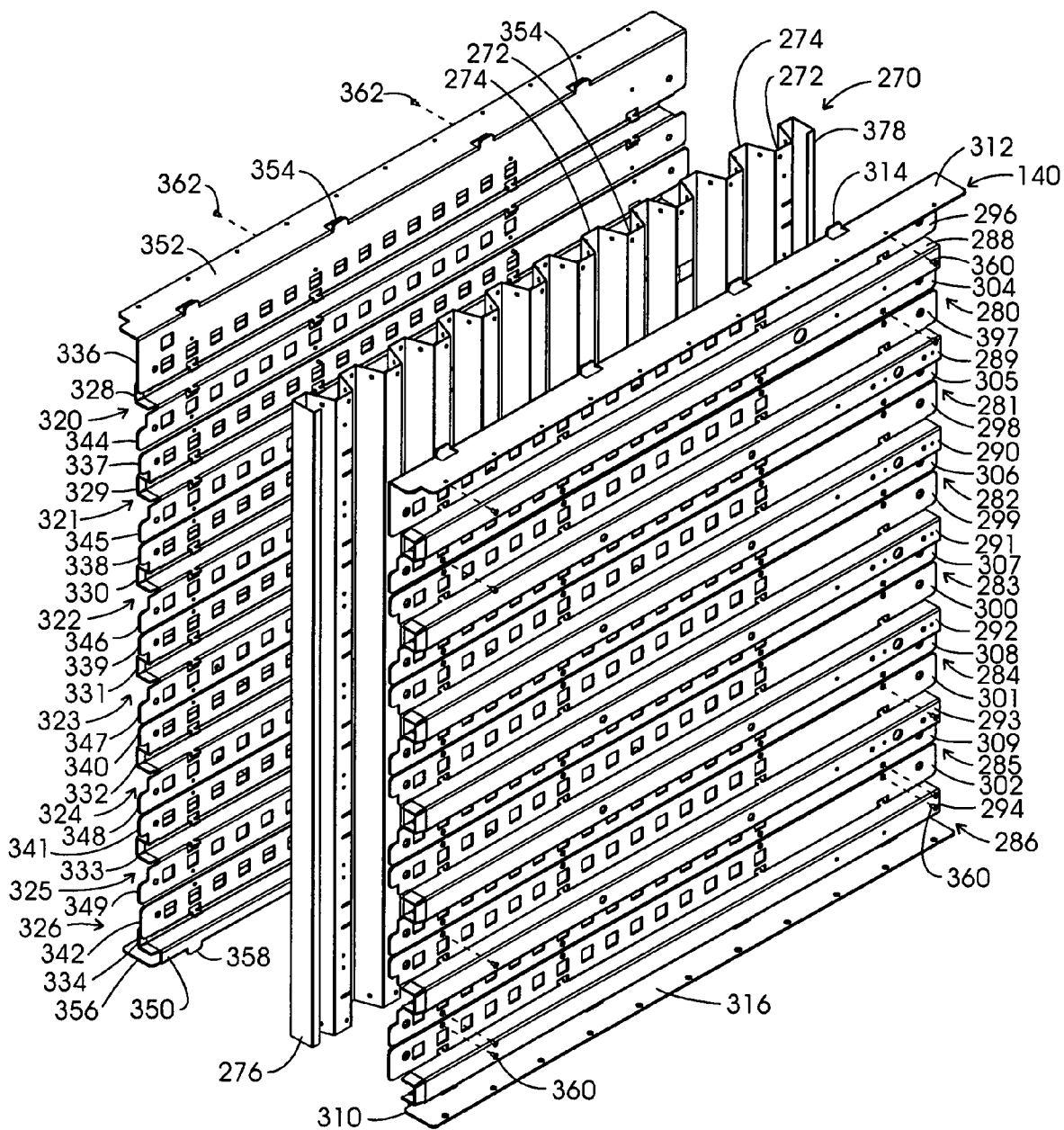
FIG. 7 is an exploded perspective view of an internal support panel employed with the transportable container of the invention.

Referring to FIG. 7, interior support panel 140 is illustrated in exploded, perspective fashion. Panel 140 is configured with an interior sheet aluminum corrugate stiffener represented generally at 270. As before, stiffener 270 is configured with peaks, certain of which are represented at 272 and valleys, certain of which are represented at 274. As in the configuration of the end panels 16 and 18, these corrugations are vertically oriented and terminate forwardly and rearwardly with integrally formed fillets 276 and 278. Connected to the peaks as at 272 of corrugate stiffener 270 are a sequence of seven vertically stacked drawer guides represented generally at 280–286. Drawer guides 280–286 are configured with respective outwardly depending horizontal channels 288–294 which are configured to slidably receive door glides one of which has been described at 162 in connection with FIG. 4. Channels 288–294 are integrally formed with upwardly depending flanges shown respectively at 296–302 and integrally formed corresponding downwardly depending flanges shown respectively at 304–310. Integrally formed with flange 296 is an upper connector flange 312 configured with alignment tabs, certain of which are revealed at 314 for connection with the under side of upper panel 12. Similarly, downwardly depending flange 310 is integrally configured with a lower connector flange 316 which also incorporates alignment tabs (now shown) and is connected by laser welding to lower panel 14.

The opposite side of panel 140 is configured with seven aluminum sheet metal drawer guides represented generally at 320–326. Guides 320–326 are configured with respective outwardly depending horizontal channels 328–334 which function to slidably receive the earlier described door glides. Each of the channels 328–334 is configured with integrally formed upwardly depending flanges 336–342 and integrally formed downwardly depending flanges shown respectively at 344–350. Upwardly disposed flange 336 is configured with an integrally formed connector flange 352 which is connected by laser welding to the underside of top panel 12.

Flange 352 is further configured with alignment tabs, certain of which are identified at 354. In similar fashion, downwardly disposed flange 350 is integrally formed with a connector flange 356 which is configured with alignment tabs, one of which is revealed at 358 and is connected by laser welds to lower panel 14.

Upwardly depending flanges 296–302 and downwardly depending flanges 304–310 are connected to the peaks 272 of stiffener 270 by laser welding. They are aligned in position for welding through the use of blind rivets, certain of which are identified at 360. In similar fashion, upwardly depending flanges 336–344 and downwardly depending flanges 344–350 are laser welded to the valleys 274 of corrugate stiffener 270. To hold those flanges in proper alignment for welding, blind rivets, certain of which are identified at 362 are utilized to properly position and align those flanges.

Figure 8:
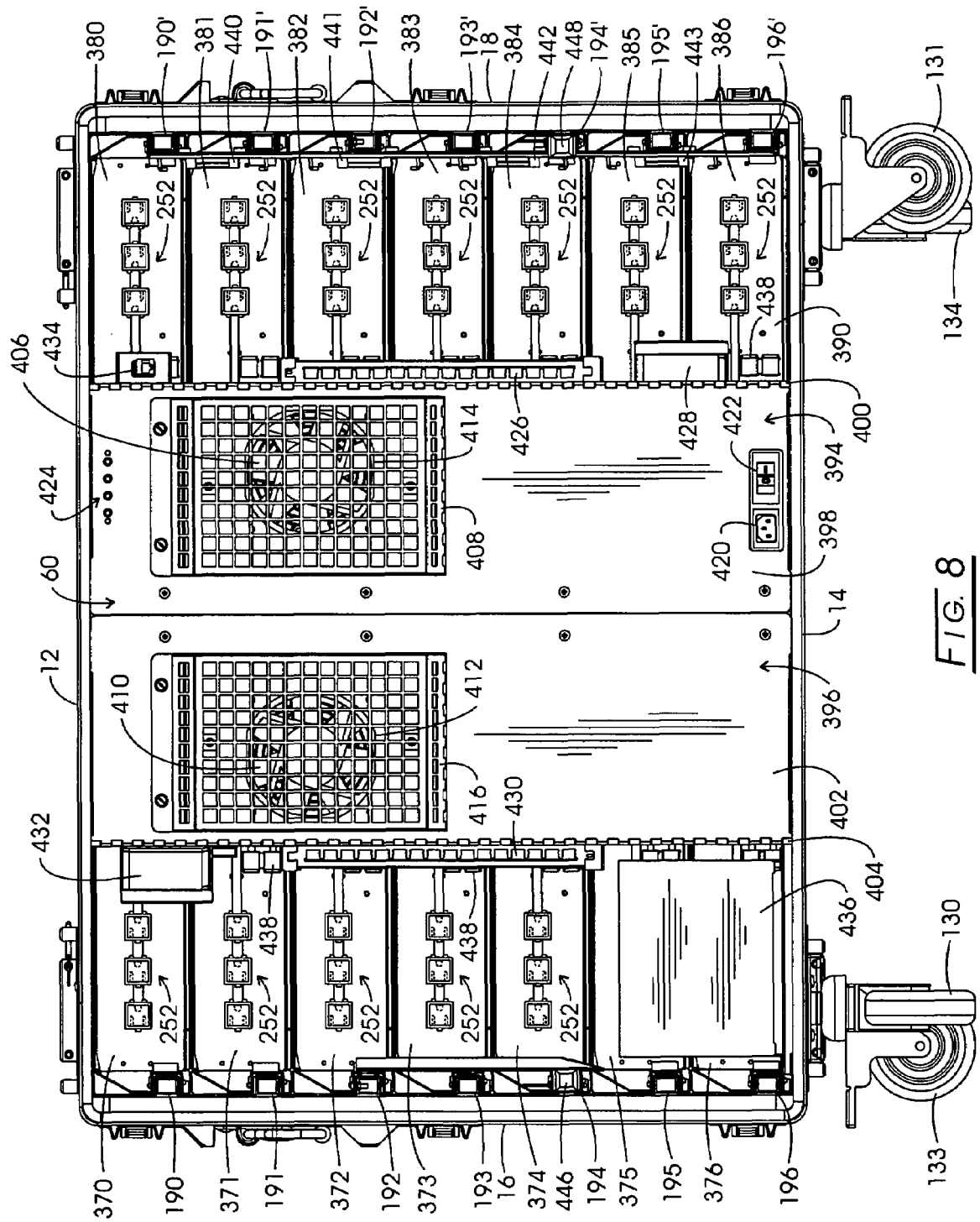
FIG. 8 is a rear view of the transportable container of the invention taken with the back panel removed.
Figure 9:
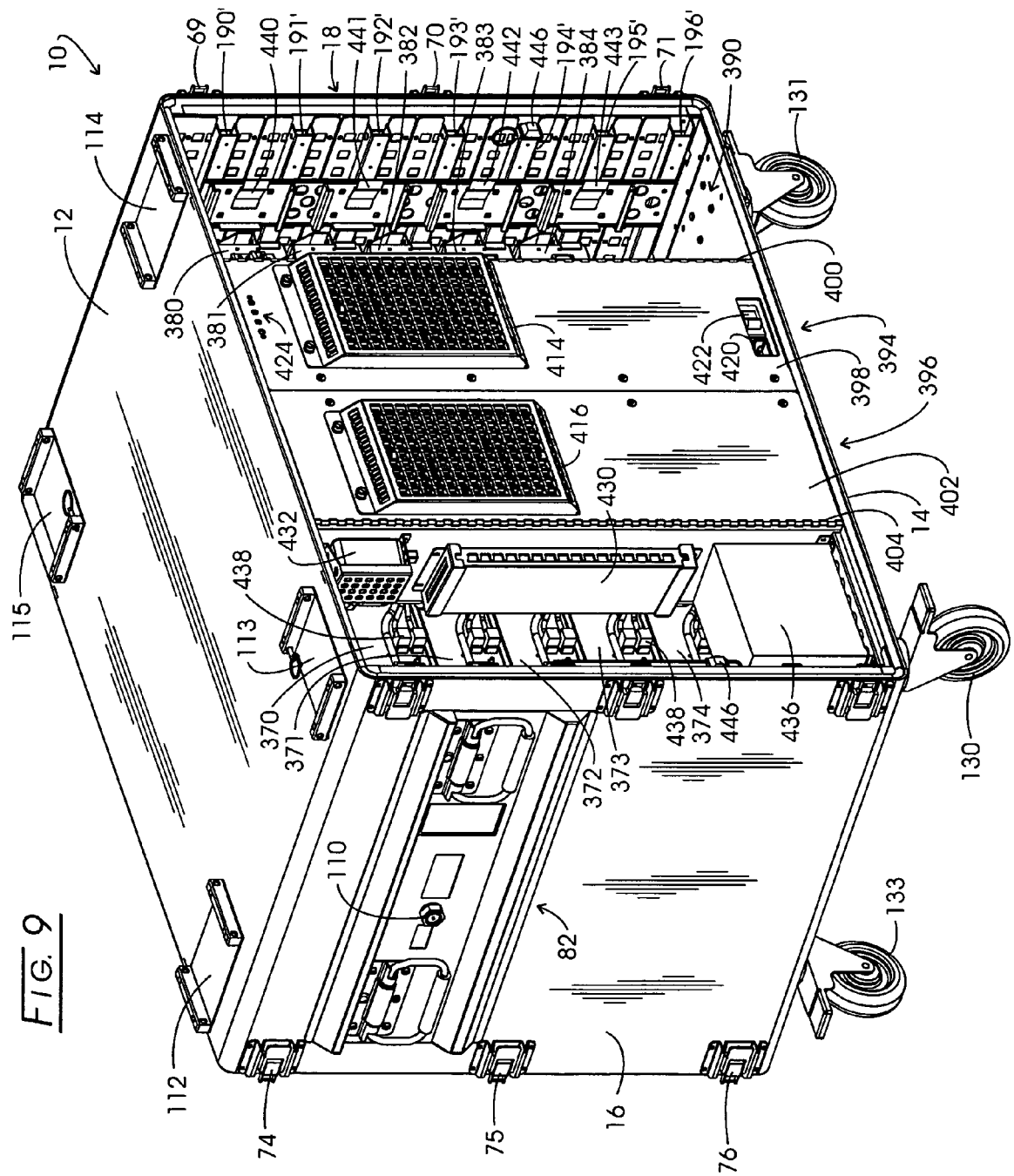
FIG. 9 is a perspective view of the transportable container of the invention with the back panel removed.

Referring to FIG. 8, a rear illustration of container 10 with back panel 62 having been removed is presented. The backs of drawers 1R–7R are shown respectively in the figure at 370–376, while the backs of drawers 1L–7L are shown respectively at 308–386. These drawer backs do not extend entirely within the containment region 60 but terminate within that region to define a rearwardly disposed support region represented generally at 390. Looking momentarily to FIG. 9, the three dimensional aspect of support region 390 is revealed. FIGS. 8 and 9 show that mounted within the support region 390 are two side-by-side air distribution plenums 394 and 396. These plenums are somewhat tower-like and extend between upper panel 12 and lower panel 14. Visible in these figures is an outward cover or door 398 of plenum 394 which is coupled thereto at an elongate hinge 400. In similar fashion, plenum 396 is configured with an outward cover or door 402 which is mounted upon an elongate hinge 404. Plenums 394 and 396 are configured from sheet aluminum and are charged with air under pressure by high pressure fans. In this regard, a high pressure fan 406 is seen extending through an air inlet 408 within cover 398. In similar fashion a high pressure fan 410 is connected interiorly against an air inlet 412 extending through cover 402. Air inlets 408 and 412 are, in turn, covered by grid-like air filter containers shown respectively at 414 and 416.

In addition to providing for cooling air distribution, plenums 394 and 396 also retain components of an electric power distribution assemblage. That assemblage is connectable with an external source of power at a line input receptacle 420 extending through cover 398. Adjacent to the receptacle 420 is a main power switch 422 also extending through cover 398. Also mounted at cover or door 398 is a simple bar graph represented generally at 424 which is comprised of four linearly aligned light emitting diodes (LEDs).

Mounted on the outward side of plenum 394 is a LAN hub 426 which receives a d.c. input from an AC/DC converter 428. Device 426 provides local area network inputs to each of the seven drawers 1L–7L. In similar fashion the outward side of plenum 396 supports a LAN hub 430 which receives a d.c. input from AC/DC converter 432. Device 430 provides LAN inputs to drawers 1R–7R. A main LAN connector 434 provides connection between an external server and the hub devices 426 and 430. Devices 426 and 430 may be provided as Type FS116 Fast Ethernet Switches With High-Speed 10/100 Mbps Auto-Sensing Connectivity at 16 Ports. The devices are marketed by Net Gear, Inc. of Santa Clara, Calif. Of the sixteen ports provided from devices 426 and 430, fourteen ports provide two LAN connections to each drawer. The devices are interconnected at one port and one port of each device connects with the other device. The devices are self configuring and full duplexed. A local server is represented at 436 mounted behind drawers R6 and R7.

Figure 10:
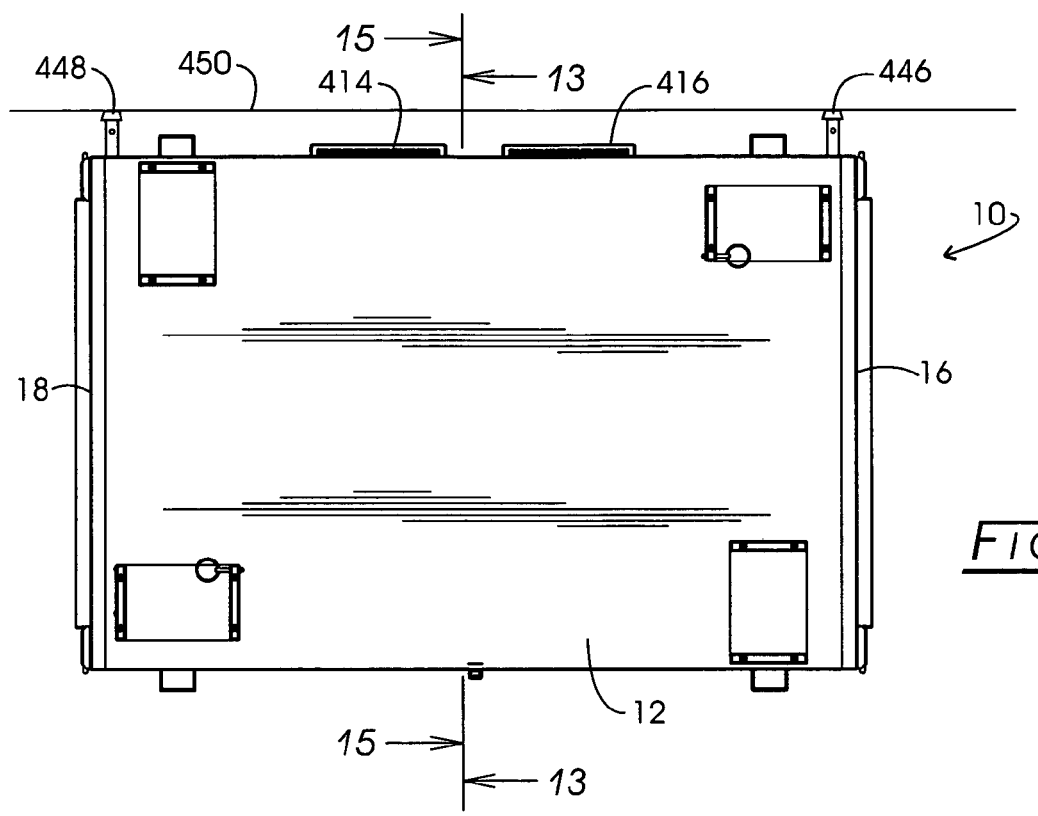
FIG. 10 is a top view of the transportable container of the invention showing the extension of a standoff engaged with the wall.

Casters 130–134 may be removed from attachment beneath lower panel 14 and stored within the service region. For this purpose caster retaining brackets 440–443 are seen mounted at the interior of end panel 18 within the support region 390. The drawer guides 190–196 integrally formed with end panel 16 are observable in FIG. 8. Inasmuch as end panel 18 is essentially a mirror image of end panel 16, those guides are shown with the same numeration at panel 18 but in primed fashion. It may be observed that the outwardly depending channel portions of drawer guides 194 and 194' function to receive respective retractable and extendable standoffs 446 and 448. In FIGS. 8 and 9 standoffs 446 and 448 are illustrated in their retracted orientation. Standoffs 446 and 448 are retained in their retracted orientation with a pinning approach and are extensible by personnel during set-up of the containers 10 to assure ambient air access to high pressure fans 406 and 410. Looking to FIGS. 10 and 11, an upstanding wall is represented at 450. Container 10 is shown positioned such that its back side is adjacent to wall 450. To assure proper spacing between that wall and the high pressure fan air inputs the standoffs 446 and 448 are extended and pin-locked to assure adequate air access to the fans.

Returning to FIG. 8, each drawer back is configured such that it not only supports two LAN connectors as at 438 but also provides support for three conditioned power a. c. receptacles the backs of certain of these groupings of three receptacles being identified in general at 452. Power conditioning is developed with a power supply mounted within plenum 394 and an associated inverter mounted within plenum 396. The door backs additionally are configured with air entrance openings for receiving fan driven air flow. In this regard, drawers 1R–7R receive air flow from a vertical sequence of air transfer outlets located forwardly within plenum 396. Correspondingly, drawers 1L–7L receive airflow from a corresponding seven air transfer outlets vertically disposed in sequence at the forward side of plenum 394.

Figure 12:
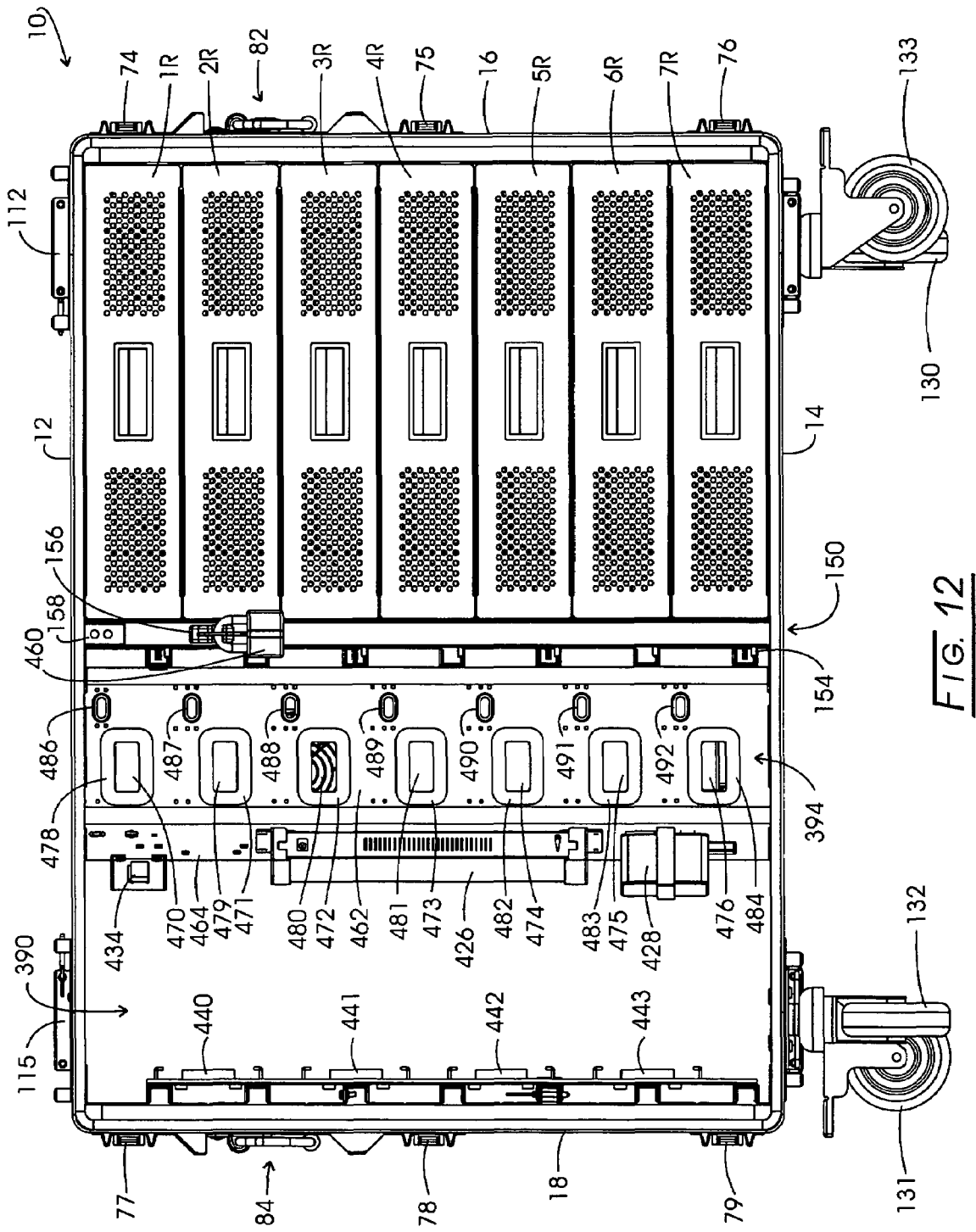
FIG. 12 is a front view of the transportable container of the invention with the front panel removed and the left side drawers removed.

Referring to FIG. 12, container 10 is illustrated as it appears with the removal of drawers 1L–7L. In the figure, the locking bar assembly 152 of vertically oriented locking assemblage 150 has been elevated to a locking orientation wherein the locking pins as at 154 will engage cavities within each of the drawers. In this orientation the drawers may be secured with a padlock, such a padlock being represented at 460. The figure reveals the sheet metal aluminum forward side 462 and outward side 464 of air distribution plenum 394. The forward side 462 of plenum 394 is seen to be configured with a vertical linear array of air transfer outlets 470–476. Each of these outlets is surmounted by a respective grommet 478–484. When drawers 1L–7L are in their closed orientations, the air transfer outlets 470–476 will be in air transfer communication with the drawer back air entrance openings. Also located within forward side 462 of distribution plenum 394 is a vertical array or sequence of seven cable distribution openings 486–492 serving as components of the cable handling scheme employed.

Figure 13:
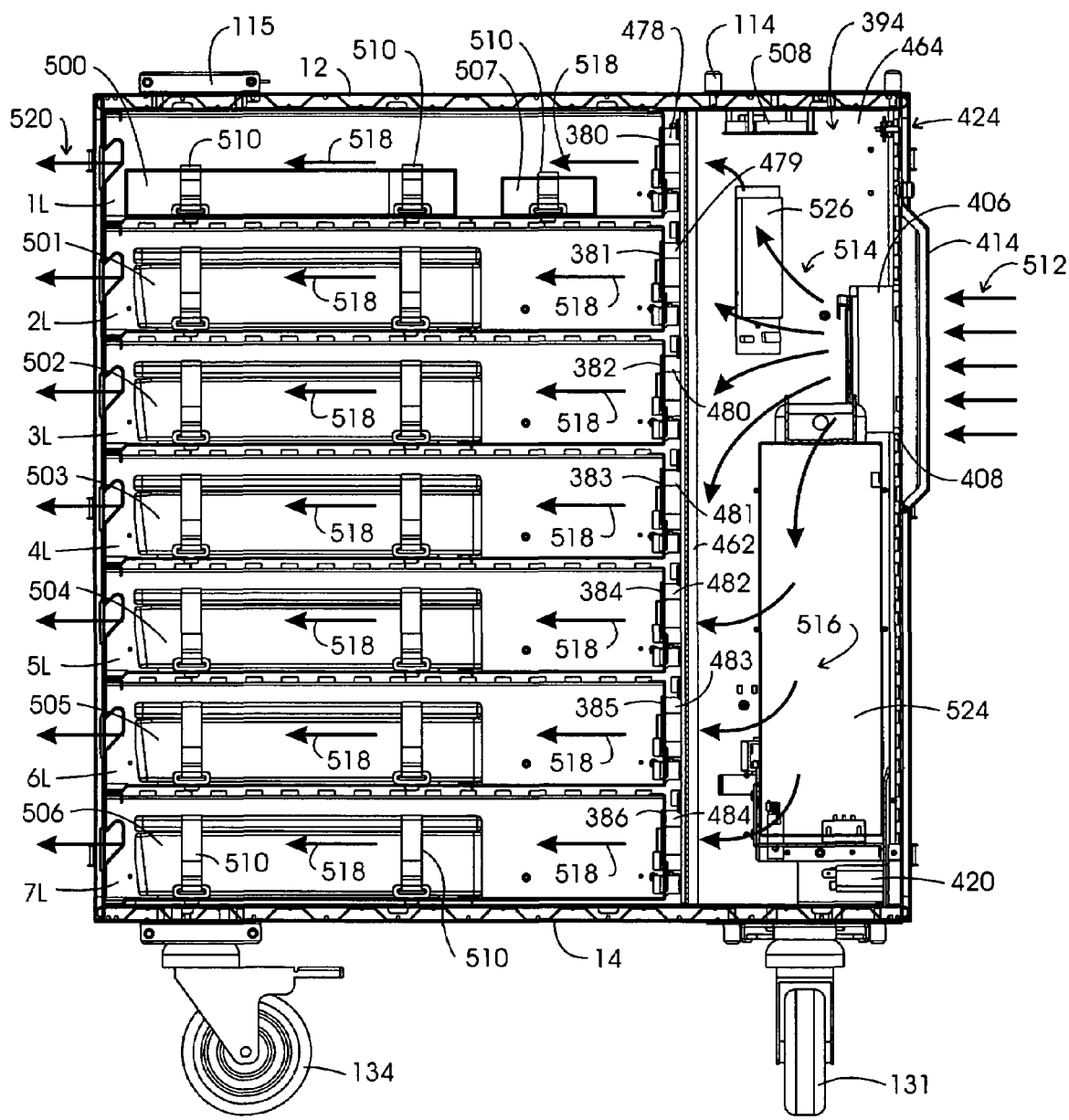
FIG. 13 is a sectional view of the transportable container of the invention taken through the plane 13—13 shown in FIG. 10.

Referring to FIG. 13, drawers 1L–7L are shown in their closed orientation. The figure shows that the backs of drawers 1L–7L as at 380–386 are in contact with respective grommets 478–484 at the forward side 462 of air distribution plenum 394. Thus air transfer communication is developed between the drawers and plenum 394 permitting air transfer through the air transfer outlets 470–476 of plenum 394 and through the air entrance openings within the drawer backs 380–386. Laptop computers 500–506 are seen secured within respective drawers 1L–7L and an additional heat generating device is shown at 507 in drawer 1L. The devices 500–507 are secured against the bottom of the drawers with straps, for example, elastomeric straps secured through apertures within the bottoms of the drawers utilizing cleats. Certain of the strap and cleat combinations are identified at 510. With the arrangement shown, ambient air as represented at arrow array 512 is drawn into the air distribution plenum 394 by high pressure fan 406. The interior of plenum 394 being thus pressurized, air under pressure will be expressed through each air transfer outlet 470–476 as represented by arrow arrays 514 and 516. Then, as represented at arrows 518 the airflow passes across the drawers including devices 500–507 to exit through air transfer openings within the fronts of drawers of 1L–7L. Air passage through these air transfer openings is represented by the vertical array of arrows represented generally at 520. These air transfer openings have been described at 142 and 144 in connection with FIG. 3. With this form of air transfer from the air distribution plenum 394 an essentially metered or constant and uniform airflow is distributed into each drawer. This airflow remains constant in each of the drawers in a closed drawer orientation even though some of the drawers are in an open orientation. Essentially the same air distribution is provided to drawers 1R–7R from air distribution manifold 396 and its associated high pressure fan 410. Certain of the air entrance openings, for example, within drawer backs 372–375 of respective drawers R2–R6 are seen in FIG. 16 and identified at 522. Mounted within plenum 394 is a power supply 524 as well as circuit boards as at 526 and 528.

Figure 14:
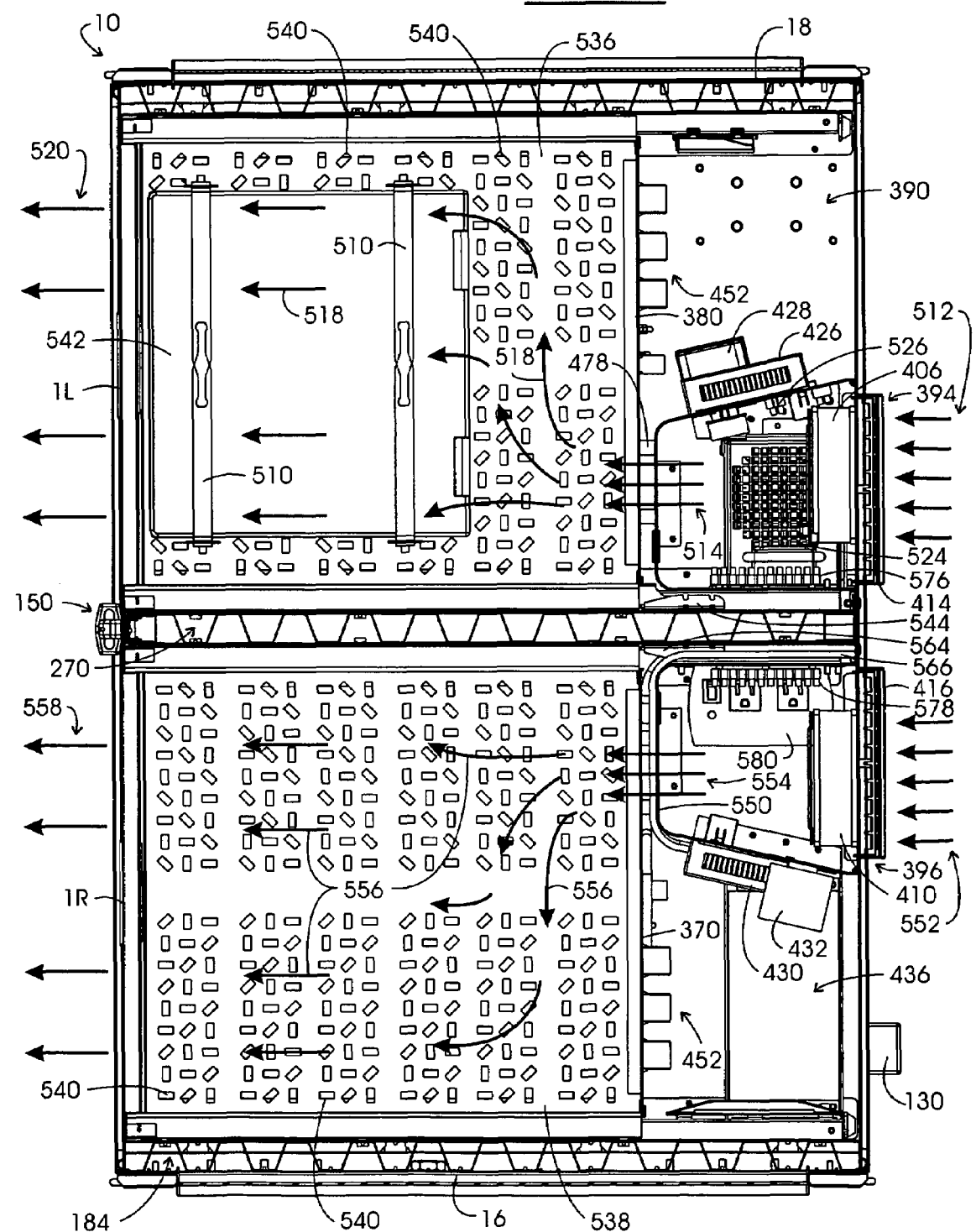
FIG. 14 is a sectional view of the transportable container of the invention taken through the plane 14—14 shown in FIG. 11.

Turning to FIG. 14, a sectional view looking down into drawers 1L and 1R is provided in conjunction with airflow path arrows. It may be noted that drawers 1L and 1R are configured with aluminum sheet metal bottoms shown respectively at 536 and 538. Each of the drawer bottoms is configured with an array or pattern of tie-down apertures certain of which are identified at 540. In particular, these apertures 540 are oriented in parallel with the drawer sides; perpendicular to the drawer sides; and angularly oriented at 45° with respect to the drawer sides. With this arrangement, tie-down cleats of straps as at 510 may be inserted within appropriate ones the apertures to secure devices such as the laptop computer 542. Looking in particular to drawer 1L, ambient air again is represented at arrow array 512, while passage of pressurized air developed from fan 406 through the air entrance opening at drawer 380 again is represented at arrow array 514. Air distribution within the drawer 1L over device 542 is represented by arrows certain of which are identified at 518. Air exiting the drawer front air transfer opening again is represented by arrow array 520. Also seen fixed to and extending from the back side of drawer 1L is a cable maneuvering bracket 544, no cable being shown associated with it in this figure.

Now looking to the support for drawer 1R, the forward side 550 of air distribution plenum 396 also is configured with a vertical sequence of air transfer outlets and associated grommets. These outlets and associated grommets are configured in the same manner as outlets 470–476 and associated respective grommets 478–484 as described in connection with FIG. 12. However, they are located at the right side of forward side 550. Each air outlet is associated in air transfer relationship with a drawer back air entrance opening when an associated drawer is in its closed orientation. As in the case of the left hand drawers, air expressed from the plenum 396 is, in effect, metered, being provided as a constant uniform airflow for each of the air transfer outlets, that flow remaining constant notwithstanding the opening of one or more of the drawers 1R–7R. Considering this airflow, ambient air input via high pressure fan 410 is represented at an arrow array identified generally at 552. Air under pressure with constant flow is expressed through a plenum air transfer outlet as represented at arrow array 554 and passes along drawer 1R as represented by arrows, certain of which are identified at 556 to be, in turn, expressed through air transfer openings within the front of drawer 1R as represented by the arrow array identified generally at 558. A cable maneuvering connector 564 is shown fixed to and extending from drawer 1R and is illustrated as being connected with cable assembly 566.

Shown additionally in plenum 394 is one of several distribution connectors 576. Such a distribution connector as at 578 is seen in plenum 396 above an inverter 580.

Figure 15:
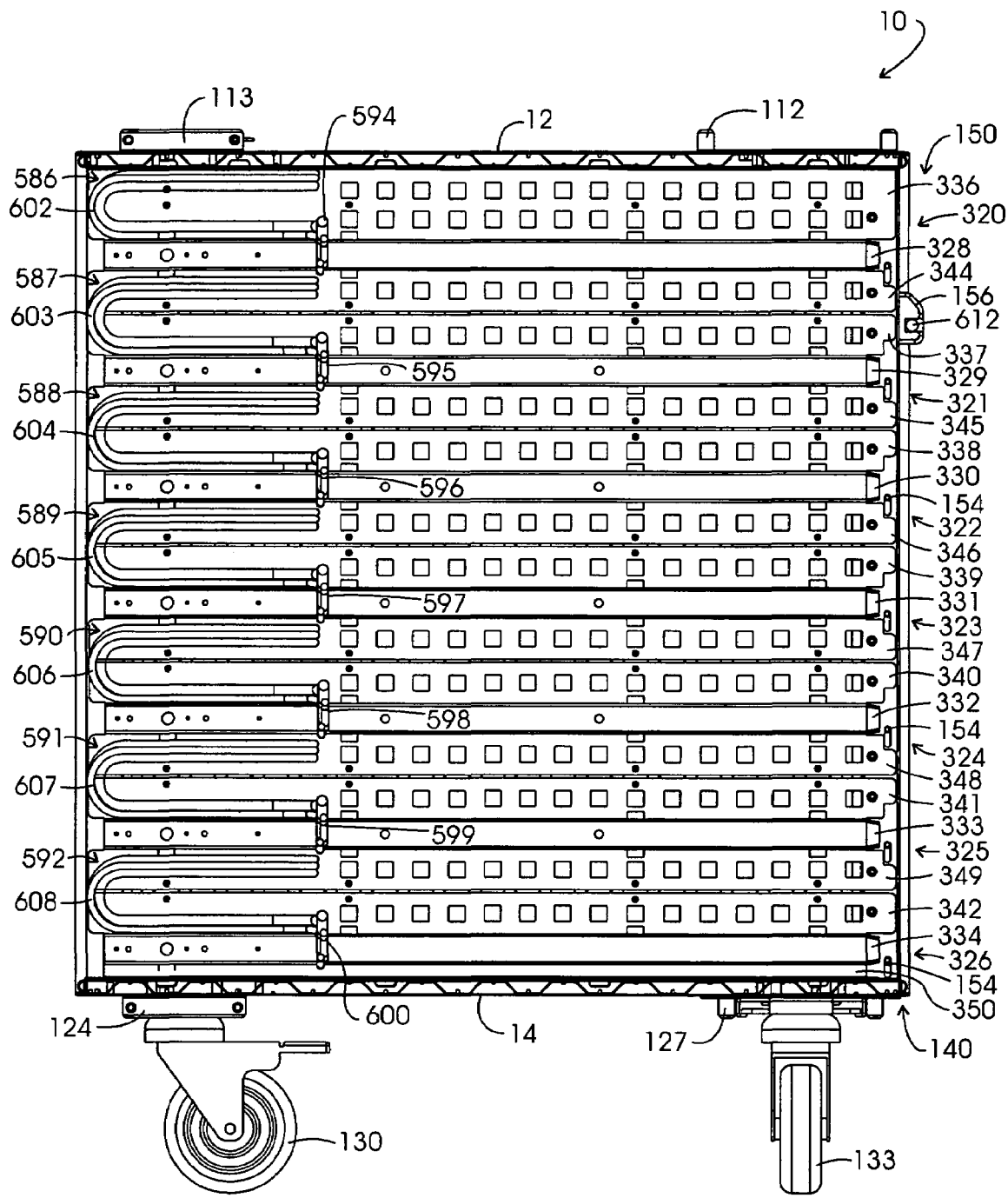
FIG. 15 is a sectional view of the transportable container of the invention taken through the plane 15—15 shown in FIG. 10.

Distribution of conditioned a. c. power and LAN communications cable is provided with a cable handling arrangement wherein those cables going to a given door are bound together in a flexible yet supportive polymeric sheath. The bound together cable grouping for a given drawer then is somewhat embedded along the flange components of the drawer guides of internal support panel 140. Turning to FIG. 15, those drawer guides serving the drawers 1L–7L are illustrated. In this regard, drawer guides 320–326 are identified in general in combination with respective upper flanges 336–342 and lower depending flanges 344–350. Additionally, outwardly extending channels 328–334 reappear. The cable assemblies associated with drawers 1L–7L are represented generally at 586–592, each being positioned above and partially resting upon an outwardly depending channel 328–334. Cable assembles 586–592 are depicted in orientations wherein the drawers 1L–7L are in a closed orientation. Each cable assembly 586–592 is configured being engaged by a cable maneuvering bracket as described in connection with FIG. 14 at 544 and 564 which are fixed to and extend rearwardly of each drawer. Engagement of the cables with such brackets for cable assemblies 586–592 are shown respectively at 594–600. From those engagement positions with the cable assemblies 586–592 the cable assemblies are directed rearwardly in freely abutting engagement with the upper surfaces of respective outwardly depending channels 328–334 to a rearwardly located dynamic rollably folding configuration shown respectively at 602–608. From those configurations 602–609 the cable extends upwardly and forwardly along the drawer guide flanges to ultimate connection with distribution connectors. With this arrangement, as a drawer is pulled toward its open orientation the associated rollably folding configuration of the group as at 602–608 will move forwardly as the cable slides along the top of respective outwardly depending channels 328–334. Conversely, when the drawers are moved towards their closed orientation, cable assemblies 586–592 slide rearwardly along the tops of the channels 328–334 while the dynamic rollably folding configurations 602–608 move rearwardly to the orientations shown in the figure. The maintenance of the configure 602–608 during drawer movement is enhanced through the utilization of the above-noted polymeric wrapping maintaining flexability but providing a modicum of stiffness.

The figure also illustrates a vertically oriented locking assemblage 150 in its upward locking position providing a through aperture or channel as at 612 for receiving a padlock as described at 460 in connection with FIG. 12.

Revisiting FIG. 16, cable assemblies with their associated dynamic rollably folding configurations are identified at 566–573 in association with respective drawer guides 280–286. Cable maneuvering brackets as earlier described at 564 are seen associated with drawers R2–R7 which provide for slidable alignment of the cables along the top of drawer guide outwardly depending channels. For convenience of illustration, air distribution plenum 396 is not shown. The figure also illustrates the storage of casters 130–133 as supported by the earlier described respective brackets 440–443.

Now considering the electrical power distribution assemblage in more detail, reference is made to FIGS. 17A and 17B should be considered together as labeled thereon. Looking to FIG. 17A a. c., line input is represented at arrow 622 as being introduced to an a.c. line filter network represented at block 624. This line input 622 essentially may be universal and can be provided anywhere from 90 to 265 volts a.c., at frequencies ranging from 40 to 440 Hz. From the line filter network 624, as represented at arrow 626, the input encounters a circuit breaker represented at block 628. From the circuit breaker function, as represented at arrow 630 the thus treated line input is directed to the input of an a.c. to d.c. power supply as represented at block 632. Power supply 632 is implemented as a 1,000 watt supply providing a 24 volt d.c. output at a d.c. bus or intermediate d.c. output represented by arrow 634. The power supply represented at block 632 has been physically illustrated at 524 in connection with FIGS. 13 and 14. The universal input at 622 is made available by virtue of a power factor correction feature within supply 632. In general, power factor correction is carried out in conjunction with a boost a.c. to d.c. converter to develop an interim d.c. voltage which, in turn, is inverted, stepped down and rectified to achieve the stable 24 volt bus output. See generally U.S. Pat. No. 6,198,642 issued Mar. 6, 2001 entitled "Compact Multiple Output Power Supply". The device further accommodates a level "B" inducted emissions filtering. The device provides inrush current protection with a 40 ampere peak max, exhibits a turn-on-time with respect to the a.c. input of 1.5 seconds and provides isolation. Further, over-voltage protection is provided. Additionally, short circuit protection is provided at its output. The device incorporates its own fan. Auxiliary d.c. outputs of +12 V and +5 V are provided by the power supply as represented at respective arrows 636 and 638. Power supply 632 may be inhibited from an external monitor as represented by arrow 640. However, even though inhibited, the +5 V supply represented at arrow 638 will be sustained. Among the self-monitoring outputs of the power supply are, as represented at arrow 642 a 24 volt d.c. ok signal indicating that the 24 volt bus or intermediate voltage at arrow 632 is within tolerance. Next, as represented at arrow 644, if the power supply 632 is over a temperature tolerance a signal is provided. As represented at arrow 646 should the fan within device 632 fail, then an indication is given to that effect. Output current is monitored as represented by the signal IMON at line 648. The signal carried at 648 will represent a one milliampere signal for each one ampere that is provided at the 24 volt d.c. intermediate output. Power supply 632 may be provided as an HPS 10 module 1,000 watt power supply marketed by the Astec Power Organization of Emerson Electric Corp. having a place of business at Carlsbad, Calif.

The intermediate 24 volt bus output at arrow 634 is directed to the input of an 800 watt power inverter with a 1600 watt peak surge characteristic as represented at block 650. Inverter 650 has been physically described at 580 in connection with FIG. 14 and functions to provide an a.c. output within the U. S. range which will be from about 97 to about 132 volts representing a nominal 117 volts a.c. at 60 Hertz frequency. The two conditioned a.c. outputs of inverter 650 are bussed together as represented at arrow 652. Inverters as at 650 may be provided, for example as Model AED800-24 marketed by Export Depot of Champlain, N.Y. Inverter 650 also can be powered from an external d.c. power supply. For example, the Humvee vehicle is equipped with a power supply providing an 28 volt d.c. output. As represented at arrow 654 this output may be directed to the input of inverter 650 in place of the output from power supply 632. The inverter output represented at arrow 652 provides line, ground (safety ground) and neutral cable outputs to drawer arrays L1–L7 and R1–R7 as symbolically represented by line array 660 in conjunction with drawer symbol array represented in general at 662. Those a.c. power inputs will be distributed to three a.c. receptacles at the back of each drawer. Each such input is protected, for example, by three PTC over-current protection devices represented at symbols 614. Devices 664 are of a positive temperature coefficient variety and perform essentially as a re-settable fuse. Accordingly, if a device is plugged in to one drawer a.c. receptacle which exhibits a short, it will cause the associatedPTC device to transition to a very high resistance to emulate an open circuit. With this arrangement, the remaining drawers will continue to receive power. Upon removal of the short circuit, the devices will recover to a conductive state. The PTC devices are, for example, marketed under the trade designation PolySwitch® marketed by Tyco Electronics Corporation of Menlo Park, Calif.

The conditioned a.c. output represented at arrow 652 also is directed to receptacles providing power to the Ethernet switches associated a.c. to d.c. converters described and illustrated in conjunction with FIG. 8 at 426, 428, 430 and 432. This input is represented in the instant figure at lines 666 and 668 extending to blocks 670 and 672. LAN system 672 is configured with 16 ports and as represented at line 674 and the line array represented generally at 676, two LAN connectors are provided for each drawer R1–R7. A 15$^{th}$ port communicates with LAN system 670 as represented at line 678. LAN assembly 670 provides two connector inputs to each of the drawers L1–L6 as represented at line 680 and line array 682. The main LAN connection intended for coupling with a server or the like and described at 434 in connection with FIG. 8 is represented at block 684 and line 686. Short circuit protection is provided with respect to LAN systems 670 and 672 again by PCT devices 668 within line 666 and 668.

The circuits observed within air distribution plenum 394 function inter alia, to provide a monitoring of the performance of power supply 632, inverter 650 and system temperature conditions. Monitoring and fand speed control is carried out by microprocessor driven circuitry, for example utilizing a type PIC 16F874 device marketed by Microchip, Technology, Inc. having input and output port features along with memory, RS232 communication and analog-to-digital conversion features. This monitoring system is represented at block 692. System 692 is coupled to ground as represented at line 694 and to the +5V d.c. output of the power supply 632 as represented at arrow 638. That +5V supply is represented again at line 696. The high pressure fans described at 406 and 410 in connection with FIG. 8 are represented at blocks 698 and 700 and are seen to be energized from the +12V output of the power supply 632 as represented at arrow 636. That +12V supply is represented at lines 702 and 704 extending to respective blocks 698 and 700. These fans may be provided as type FFB120×120×38 MM series marketed by the Delta Electronics Group of Delta Products Corporation of Freemont, Calif. Fan speed is monitored by tachometer outputs from the fans as represented at lines 706 and 708, while fan speed control is provided by a control circuit represented at block 710. Control 710 responds to fan speed as represented at lines 712 and 714 and is under the control of the monitor system as represented at line 716. Under the command of the monitoring system, the fan control 710 can vary the speed of the fans 698 and 700 from their rated speed to 50% of that speed. As noted above, the amount of cooling air expressed into the drawers R1–R7 and L1–L7 from the plenums 394 and 396 is a constant airflow. Additionally, the container interior essentially is formed of thermally conductive aluminum such that the heat load may be considered to be essentially uniform. As a consequence, the thermal condition of the containment region 60 may be quantified by monitoring the inlet air temperature, for example, by mounting a single thermister at the output side of fan 406. This air temperature value is then compared with the amount of power being drawn by inverter 650 at 24 volt bus 634. Accordingly, the current at that bus 634, as monitored at line 648, is directed to resistor 718 which is configured with ground and attached at lines 720 and 722 to define a current mirror providing a voltage value to the monitoring system corresponding with the load on the inverter. Logic at the monitoring system 692 provides for starting the fans at 100% of speed rating, that speed then is adjusted in accordance with the ambient air temperature and heat system load. The inlet air temperature sensor is represented at block 724 and its association with the monitoring system 692 is represented at arrow 726.

System load measured with respect to the signal IMON available from line 648 also is monitored by the monitoring and control system 692 to energize the simple four LED bar graph array illustrated in connection with FIG. 8 at 424 and represented in the instant figure at block 728 in conjunction with arrow 730. The first three LEDs in this sequence of four are green and the final LED is red. The first of these green LEDs is energized where the load witnessed by inverter 650 is less than 50% of rated load. The first and second green LEDs are energized where that load falls between 50% and 70% of rated load. The three green LEDs are energized where the witnessed load is between 70% and 90% of rated load and the three green LEDs and the fourth red LED are energized where the load is greater than 90% of rated load.

Load measurement along with ambient temperature values are employed in providing fan control. The variable speed algorithm for the fans is active between ambient temperature of 25° C. and 30° C. Above 35° C. ambient, fan speed is held at a maximum value. If the monitored load from bus 634 exceeds 75% of rated value and the ambient temperature measured at sensor 724 is greater than 30° C., fan speed also is held at a maximum value. Where the ambient temperature is less than about 5° C. the fan is run at high speed in order to assure starting for about four seconds and then at low speed for about one minute, whereupon it is turned off for three minutes and that cycle is repeated.

As noted above, the monitor and control system 692 also incorporates a capability for inhibiting the power supply 632 as described in conjunction with arrow 640. The monitoring and control system requires that the 24 volt bus at arrow 634 must be enabled for a minimum of about ten seconds before an inhibit signal may be imposed. This control further monitors the activity of fans 698 and 700. In the event one of those fans has failed then the inhibit signal at line 640 is activated. If the inlet temperature as measured at temperature sensor 724 exceeds 50° C. then an inhibit signal is activated. However, if the inlet temperature has exceeded 50° C. and then is reduced below 48° C. the inhibit signal line 640 is removed. If the inlet temperature exceeds 45° C. and the load witnessed at 24 volt bus line 634 exceeds 75% of rated value then the inhibit signal is imposed at line 640. If the inlet temperature has exceeded 45° C. and the load witnessed at the 24 volt bus line 634 has exceeded 75% of rated value and the temperature is now less than 40° C., then an inhibit signal is removed.

As described in connection with FIG. 3, a dual tri-color LED assemblage display 158 is provided at the front of container 10. One of these tri-color LED assemblages is labeled "power" and is symbolically represented in the instant figure at 734 in conjunction with arrow 736. In similar fashion the second of the tri-color LED assemblages is labeled "cooling" and is symbolically represented in the instant figure at 738 in conjunction with arrow 740. LED assemblages 734 and 738 are comprised of two LED functions, one being red and the other being green. When both are energized simultaneously an amber color output results. A green energization of LED assemblage 734 occurs when the loading of inverter 650 is within tolerance. That LED assemblage transitions to an amber colored output if the inlet temperature measured by temperature sensor 724 is greater than 35° C. and the load is greater than 80% of the rated load at inverter 650. That amber colored output also occurs if the inlet temperature measured is greater than 40° C. and the load witnessed at the inverter 650 is greater than 65% of rated load. The amber colored output also is provided if the inlet temperature as measured is greater than 45° C. and the load witnessed at the inverter 650 is greater than 50% of rated load. Power LED 730 will flash red if the inverter 650 output is greater than 132 volts a.c. or less than 97 volts a.c.

Note that the a.c. output of inverter 650 is monitored as represented by arrow 742, block 744 labeled "a.c. detect" and arrow 746. Finally, power LED 734 will be illuminated with a red color in the event that the output at 24 volt bus 634 is inactive.

The monitor and control system 692 energizes cooling LED 738 to a green output where the fans 702 and 704 are operating and the inlet temperature measured at sensor 724 is less than 40° C. An amber flashing output is provided at LED assemblage 738 where the fans 698 and 700 are operating below half of the control required speed. A continuous amber light output is provided where the inlet temperature measured at temperature sensor 724 is greater than 40° C. LED assembly 738 is energized to provide a flashing red output where fans 702 and 704 are operating below one fourth of their control designated speed. Finally, the LED assembly 738 is caused to be illuminated with a continuous red output where the inlet temperature measured at temperature sensor 724 is greater than 50° C.

Internal monitors of inverter 632 also are monitored. In this regard, the 24 volt d.c. ok signal at arrow 642 is monitored as represented at arrow 748. The over-temperature signal represented at arrow 644 is monitored as represented at arrow 750. Fan fail or failure of the internal fan within inverter 632 as described in conjunction with arrow 646 is monitored as represented at arrow 752.

In the event of an occurrence of one of these faults, the monitor and control system will attempt a restart four to five times. With a final restart failure, power LED assemblage 734 is energized to provide a solid-state red output.

In general, laptop computers are rated for operation within a temperature range of from about 0° C. to about 50° C. If the container 10 is within an ambient environment where the temperature is less than 5° C., the monitor and control system 692 will turn the fans 698 and 700 off for three minutes to permit the containment region 60 to warm up. This also warms up the inverter 650. The fans are then restarted on high for four seconds, whereupon they are controlled to operate at lowest speed for about one minute.

As indicated at line 760 and block 762 the monitoring and control system 692 is provided with an RS 232 port. Additionally as represented at line 764 and block 766 an optional RS 232 to Ethernet converter may be provided to establish a LAN interface.

Referring to FIG. 18, a wiring diagram for power distribution to left drawers L1–L7 and to two auxiliary a.c. receptacles within the service region is presented. These power cables will incorporate a line output, a ground output and a neutral output. A line output to those drawers is represented at line 770 extending to a connector 772 which is configured with line 774. From connector 772 a line sense signal corresponding with that described at 744 is provided as represented at line 776 and a line output array of leads is provided as represented at array 778. Protection is then provided by the earlier-described re-settable protection devices described at 664 and represented in general with that same numeration. The distribution then continues as represented at line array 780 to connector 782 for cable distribution as represented at line array 784 to drawers L1–L7 as well as to two auxiliary receptacles within the service region here labeled as "Baffle-LF1" and "Baffle-LF2". The ground component is provided as represented at line 788 extending to connector 790. Connector 790 is configured with line 792 to provide a common output including coupling with safety ground as represented at line 794. This ground is provided to the drawers L1–L7 as well as to auxiliary receptacles represented at line array 796.

The neutral component is provided as represented at line 800 extending to connector 802. Connector 802 is configured with line 804 to provide a common output and also to provide a neutral sense as represented at line 806 which is a part of the a.c. detect function described in connection with block 744 in FIG. 7B. Distribution of the neutral component to drawers L1–L7 is represented at line array 808. The same form of distribution is provided in connection with drawers R1–R7.

Referring to FIG. 19, LAN and power distribution wiring diagrams are presented, again with respect to left drawers L1–L7. In the figure, LAN hub 426 is reproduced in conjunction with a.c./d.c. converter 428 which is indicated as being plugged in to one of the above-described auxiliary a.c. receptacles represented at 810. Receptacle 810 receives an a.c. input from cable 812 as represented by a three-line input and shield symbol represented generally at 814. A second auxiliary receptacle is shown at 816 in conjunction with a three-fine input 818 with shielding as represented generally at 820.

LAN hub 426 is shown by line 822 as having its port, P2 extending to the main LAN input earlier-described and identified at 684. The remaining 14 ports are shown connected by line array 824 to provide dual inputs to drawers L1–L7 via the cable array represented generally at 826. The discrete cable component extending to drawer one (L1) is shown at 828 having two LAN inputs to LAN connectors 830 and 832 and three shields of three-line inputs extending to three a.c. receptacles 834–836. This arrangement is repeated for each drawer from drawer L1 to drawer L7 as represented by the horizontal dotted lines directed to drawer cable component 838. Cable component 838 is seen having two LAN inputs extending to LAN connectors 840 and 842. Additionally, three conditioned power a.c. inputs are seen extending from the cable 838 to three a.c. receptacles 844–846.

Since certain changes may be made in the above-described system and apparatus without departing from the scope of the invention herein involved, it is intended that all matter contained in the description thereof and shown in the accompanying drawings shall be interpreted as illustrative and not in a limiting sense.

The invention claimed is:

1. A transportable container for electrical devices comprising:

a rigid generally rectangular bottom panel having a bottom panel length extending between oppositely disposed bottom side ends and a bottom panel width extending between oppositely disposed bottom length ends, said bottom panel being configured having generally parallel spaced apart interior and exterior sheet members connected with peak and valley portions of a bottom corrugate stiffener;

a rigid generally rectangular top panel having a top panel length extending between oppositely disposed first and second top side ends corresponding with said bottom panel length and a top panel width extending between oppositely disposed top length ends corresponding with said bottom panel width, said top panel being configured having generally parallel spaced apart interior and exterior sheet members connected with peak and valley portions of a top corrugate stiffener;

a rigid generally rectangular first end panel having a first end panel height extending between oppositely disposed first height edges and a first end panel width extending between oppositely disposed first width edges corresponding with said bottom and top panel widths, said first end panel being configured having an exterior sheet member spaced from an interior plurality of parallel drawer guides, said exterior sheet member and interior plurality of drawer guides being connected with peak and valley portions of a first end corrugate stiffener;

a rigid generally rectangular second end panel having a second end panel height extending between oppositely disposed second height edges corresponding with said first end panel height and a second end panel width extending between oppositely disposed second width edges corresponding with said first end panel width, said second end panel being configured having an exterior sheet member spaced apart from an interior plurality of parallel drawer guides, said exterior sheet member and interior plurality of drawer guides being connected with peak and valley portions of a second end corrugate stiffener;

one said height edge of said first end panel being fixed to and extending normally upwardly from said bottom panel at one bottom side end to define a first bottom corner;

one said second height edge of said second end panel being fixed to and extending normally upwardly from said bottom panel at the bottom side end opposite said one bottom side end to define a second bottom corner;

said first top side end of said top panel being fixed to and extending normally from said first end panel at the first height edge upwardly disposed from said one first height edge to define a first top corner;

said second top side end of said top panel opposite said first top side end being fixed to and extending normally from said second end panel at the second height edge upwardly disposed from said one second height edge to define a second top corner;

said bottom, top and first and second end panels defining a containment region with generally rectangular front and back edge peripheries defined by said bottom length ends, said top length ends, and said first and second width edges;

a plurality of drawers within said containment region, each drawer of said plurality having a drawer front spaced a drawer length along a drawer bottom from a drawer back, said plurality of drawers being mounted for movement upon said drawer guides between open and closed orientations, each said drawer front being located adjacent said front periphery when in said closed orientation; and an electric power distribution assemblage mounted within said containment region connectable with an external source of electric power having one or more electric power distribution lines extending to one or more said drawers.

2. The transportable container of claim 1 further comprising:

a front panel removably mountable at said front edge periphery to effect a front closure of said containment region; and a back panel removably mountable at said back edge periphery to effect a back closure of said containment region.

3. The transportable container of claim 2 in which:

said front panel and said back panel are configured as aluminum metal honeycomb stiffened panels.

4. The transportable container of claim 1 further comprising:

first and second manual lifting handle assemblies fixed respectively to said first and second end panels.

5. The transportable container of claim 1 further comprising:

an internal support panel within said containment region fixed normally between said bottom panel and said top panel and configured having a first side facing and spaced from said first end panel and an oppositely disposed second side facing and spaced from said second end panel, said support panel being configured at said first side with a first plurality of parallel drawer guides spaced from a second plurality of parallel drawer guides at said second side, said first and second pluralities of drawer guides being connected with peak and valley portions of an interior corrugate stiffener; and said plurality of drawers are mounted upon said drawer guides between said first end panel and said interior panel and between said second end panel and said interior panel.

6. The transportable container of claim 5 in which:

said internal support panel first and second pluralities of drawer guides are configured as a vertically disposed sequence of outwardly depending horizontal channels having integrally formed upwardly and downwardly depending flanges connected with said corrugate stiffener.

7. The transportable container of claim 6 in which:

said drawer length is less than said top and bottom panel width such that each said drawer back is spaced inwardly from said containment region back edge periphery to provide a support region;

said electric power distribution lines are configured having one terminus connected with a said drawer, extending rearwardly therefrom within said support region, supported upon a said internal support panel horizontal channel in adjacency with a said upwardly depending flange and configured with a dynamic rollably folded portion moveable along said channel in correspondence with movement of said drawer between said open and closed orientations.

8. The transportable container of claim 6 in which:

said internal support panel is formed of an aluminum metal; and said upwardly and downwardly depending flanges are connected with said corrugate stiffener with laser welds.

9. The transportable container of claim 1 in which:

said bottom and top panels are formed of an aluminum metal; and said interior and exterior sheet members are connected with said corrugate stiffener with laser welds.

10. The transportable container of claim 1 in which:

said first and second end panel first and second pluralities of drawer guides are configured as a vertically disposed sequence of outwardly depending channels having integrally formed upwardly and downwardly depending flanges connected with said corrugate stiffener.

11. The transportable container of claim 10 in which:

said first and second end panels are formed of an aluminum metal; and said upwardly and downwardly depending flanges are connected with said corrugate stiffener with laser welds.

12. The transportable container of claim 1 in which:

said drawer length is less than said top and bottom panel width such that each said drawer back is spaced inwardly from said containment region back edge periphery to provide a support region; and components of said electric power distribution assemblage are mounted within said support region.

13. The transportable container of claim 12 in which:

said electric power distribution assemblage one or more electric power distribution lines extend to one or more electrical output receptacles mounted at the drawer back of one or more said drawers.

14. The transportable container of claim 1 in which:

one or more of said drawer bottoms is configured with a pattern of tie-down accepting apertures.

15. The transportable container of claim 1 in which:

each said drawer front and drawer back are configured such that when all are within said closed orientation, each drawer front and drawer back is closely spaced from an adjacent respective drawer front and drawer back;

and further comprising a vertically oriented locking assemblage for securing all said drawers when in said closed orientation.

16. The transportable container of claim 1 further comprising:

one or more local area network hubs mounted within said containment region having one or more LAN communication lines extending to LAN connectors within one or more said drawers.

17. The transportable container of claim 1 in which:
said top panel exterior sheet member, said bottom panel exterior sheet member and said first and second end panel exterior sheet member are coated with a polyurethane material.

18. The transportable container of claim 1 in which:
said top panel exterior sheet member extends between oppositely disposed first and second exterior top edges recessed inwardly a top flange distance from said first and second top side ends;
said first end panel exterior sheet member extends at least said top flange distance beyond a said first height edge adjacent said top panel to define a first top flange with a first top flange edge;
said first top flange is bent to define said first top corner, said first top flange edge abutting said first exterior top edge and is fixed to said top corrugate stiffener;
said second end panel exterior sheet member extends at least said top flange distance beyond said second height edge adjacent said top panel to define a second top flange with a second top flange edge; and
said second top flange is bent to define said second top corner, said second flange edge abutting said second exterior top edge and is fixed to said top corrugate stiffener.

19. The transportable container of claim 18 in which:
said bottom panel exterior sheet member extends between oppositely disposed exterior first and second bottom edges recessed inwardly a bottom flange distance from said bottom side ends;
said first end panel exterior sheet member extends at least said bottom flange distance beyond a said first height edge adjacent said bottom panel to define a first bottom flange with a first bottom flange edge;
said first bottom flange is bent to define said first bottom corner, said first bottom flange edge abutting said exterior first bottom edge and is fixed to said bottom corrugate stiffener;
said second end panel exterior sheet member extends at least a bottom flange distance beyond said second height edge adjacent said bottom panel to define a second bottom flange with a second bottom flange edge; and
said second bottom flange is bent to define said second bottom corner, said second bottom flange edge abutting said exterior second bottom edge and is fixed to said bottom corrugate stiffener.

20. The transportable container of claim 1 in which:
said bottom panel is configured with four first stacking cleats extending from said bottom panel exterior sheet member and having a first configuration and first orientations; and
said top panel is configured with four second stacking cleats extending from said top panel exterior sheet member and having a second configuration and second orientations enagable in stacking relationship with said first stacking cleats of another transportable container.

21. The transportable container of claim 20 further comprising:
four freely rotatable casters removably mountable with said bottom panel at said four first stacking cleats; and
said containment region further contains four storage cleats for receiving and removably securing said four casters.

22. A transportable container for electrical devices, comprising:
a rigid generally rectangular bottom panel configured with spaced apart metal sheet members connected against a corrugate stiffener;
a rigid generally rectangular top panel corresponding with said bottom panel and configured with spaced apart metal sheet members connected against a corrugate stiffener;
first and second rigid end panels coupled with said top and bottom panels to define a containment region having generally rectangular front and back edge peripheries, said containment region being configured having an exterior metal sheet member spaced from an interior plurality of parallel drawer guides, said exterior sheet member and interior plurality of drawer guides being connected against a corrugate stiffener;
a plurality of drawers within said containment region arranged in one or more generally vertically aligned stacks, each drawer having a front spaced along a drawer bottom from a drawer back, each drawer of said plurality being mounted for movement between open and closed orientations upon said drawer guides, when in said closed orientation each said drawer front being located adjacent said front periphery and each said drawer back is spaced inwardly from said containment region back edge periphery to provide a support region and one or more said drawer backs of said plurality of drawers having an air entrance opening;
an electric power distribution assemblage connectable with an external source of electrical power, mounted within said support region having one or more electric power distribution lines extending to one or more said drawers;
one or more air distribution plenums mounted at said support region, each having one or more air transfer outlets located for air transfer communication with said drawer back air entrance opening of said one or more drawer backs when said drawer is in a closed orientation, each said plenum having one or more air inlets and one or more fans configured in air transfer relationship with said air inlets, and said one or more fans being controllable to provide air under pressure to an associated said plenum.

23. The transportable container of claim 22 in which:
said air distribution plenum comprises a vertically disposed chamber having said air outlets arranged in vertically spaced relationship.

24. The transportable container of claim 22 in which:
said drawer fronts are configured with air transfer openings.

25. The transportable container of claim 24 in which:
said drawers are formed of an aluminum metal.

26. The transportable container of claim 22 further comprising:
a temperature sensor mounted at said support region having an output corresponding with sensed temperature; and
a control circuit responsive to said sensed temperature levels to effect corresponding speed control over said one or more fans.

27. The transportable container of claim 26 in which:
said electric power distribution assemblage comprises an electric power conditioning assembly mounted at said support region having power treatment components connectable with said external source of power and deriving an intermediate output at a d.c. level and an inverter responsive to said intermediate output providing a.c. power to said distribution lines having a load level characteristic corresponding with said intermediate output and having a maximum rated load value;

said temperature sensor sensed temperature level corresponding with the temperature of ambient air at a said plenum air inlet; and said control circuit is responsive to said sensed temperature level and said load characteristic to provide corresponding speed control over said one or more fans to effect predetermined fan speeds.

28. The transportable container of claim 27 in which:

said bottom panel, said top panel, said first and second end panels and said plurality of drawers are formed of an aluminum metal.

29. The transportable container of claim 27 in which:

said one or more fans have a maximum speed and a low speed; and said control circuit is responsive to a sensed temperature level above about 35° C. to effect operation of said one or more fans at said maximum speed.

30. The transportable container of claim 29 in which:

said control circuit is responsive in the presence of a sensed temperature level above about 30° C. and a said load characteristic above about 75% of said maximum rated load value to effect operation of said one or more fans at said maximum speed.

31. The transportable container of claim 29 in which:

said control circuit is responsive in the presence of a sensed temperature level below about 5° C. to effect operation of said one or more fans intermittently at low speed.

32. The transportable container of claim 27 further comprising:

a cooling assemblage of light emitting diodes energizable to provide visibly perceptive cueing states; and said control circuit is responsive in the presence of said one or more fans operating at a said predetermined speed and a sensed temperature level below about 40° C. to energize said cooling assemblage to effect a first said cueing state;

said control circuit is responsive to fan speeds representing less than about one-half of a said predetermined fan speed to carry out energization of said cooling assemblage to effect a second said cueing state; and said control circuit is responsive in the presence of a sensed temperature level above about 40° C. to energize said cooling assemblage to effect a third said cueing state.

33. The transportable container of claim 32 in which:

said control circuit is responsive to fan speeds representing less than about one-fourth of a said predetermined fan speed to carry out energization of said cooling assemblage to effect a fourth said cueing state.

34. The transportable container of claim 33 in which:

said control system is responsive in the presence of a sensed temperature level above about 50° C. to carry out energization of said cooling assemblage to effect a fifth said cueing state.

35. The transportable container of claim 22 in which:

said air distribution plenum one or more air inlets are located adjacent said back edge periphery; and further comprising one or more generally horizontally disposed standoffs mounted at said support region having an outwardly disposed contact end with a retracted orientation locating said end inwardly from said back edge periphery and deployable outwardly an air access distance effective to assure airflow into said one or more air distribution plenum one or more air inlets.

36. The transportable container of claim 22 further comprising:

a front panel removably mountable at said front edge periphery to effect a front closure of said containment region; and a back panel removably mountable at said back edge periphery to effect a back closure of said containment region.

37. The transportable container of claim 36 in which:

said front panel and said back panel are configured as aluminum metal honeycomb stiffened panels.

38. The transportable container of claim 36 further comprising:

first and second manual lifting handle assemblies fixed respectively to said first and second end panels.

39. The transportable container of claim 22 further comprising:

an internal support panel within said containment region fixed normally between said bottom panel and said top panel, configured having a first side facing and spaced from said first end panel and an oppositely disposed second side facing and spaced from said second end panel, configured at said first side with a first plurality of parallel drawer guides spaced from a second plurality of parallel drawer guides at said second side, said first and second pluralities of drawer guides being connected with an interior corrugate stiffener; and a first plurality of said drawers are mounted upon said drawer guides between said first end panel and said interior panel and a second plurality of said drawers are mounted upon said drawer guides between said second end panel and said interior panel.

40. The transportable container of claim 39 in which:

said internal support panel first and second pluralities of drawer guides are configured as a vertically disposed sequence of outwardly depending horizontal channels having integrally formed upwardly and downwardly depending flanges connected with said corrugate stiffener.

41. The transportable container of claim 39 in which:

said one or more air distribution plenums comprise:

a first plenum located adjacent said internal support panel first side, having a first plurality of said air outlets located for air transfer communication with drawer back entrance openings of said first plurality of drawers, and having a first said air inlet operably associated in air transfer relationship with a first said fan, and a second plenum located adjacent said internal support panel second side, having a second plurality of said air outlets located for air transfer communication with drawer back entrance openings of said second plurality of drawers, and having a second said air inlet operably associated in air transfer relationship with a second said fan.

42. A transportable container for electrical devices, comprising:

a rigid generally rectangular bottom panel configured with spaced apart metal sheet members connected against a corrugate stiffener;

a rigid generally rectangular top panel corresponding with said bottom panel and configured with spaced apart metal sheet members connected against a corrugate stiffener;

first and second rigid end panels coupled with said top and bottom panels to define a containment region having generally rectangular front and back edge peripheries, said containment region being configured having an exterior metal sheet member spaced from an interior plurality of parallel drawer guides, said exterior sheet member and interior plurality of drawer guides being connected against a corrugate stiffener;

a plurality of drawers within said containment region arranged in one or more generally vertically aligned stacks, each drawer having a front spaced along a drawer bottom from a drawer back, mounted for movement between open and closed orientations upon said drawer guides;

an electric power conditioning assembly having power treatment components connectable with an external source of line power and deriving an intermediate output at a d.c. level, having an inverter with an input responsive to said intermediate output to provide a conditioned a.c. output; and a power distribution assembly coupled with said inverter conditioned a.c. output, having one or more a.c. lines extending to one or more a.c. couplings within one or more of said plurality of drawers.

43. The transportable container of claim 42 in which:
said electric power conditioning assembly power treatment components comprise a transient suppression network.

44. The transportable container of claim 42 in which:
said electric power conditioning assembly power treatment components comprise an electromagnetic interference filter network.

45. The transportable container of claim 42 in which:
said electric power conditioning assembly comprises a converter controllable to carry out power factor correction and derive an interim d.c. voltage output.

46. The transportable container of claim 45 in which:
said electric power conditioning assembly further comprises an inverter and transforming network responsive to said interim d.c. voltage output to provide a stepped-down voltage output.

47. The transportable container of claim 46 in which:
said electric power conditioning assembly further comprises a rectifier network responsive to said stepped-down voltage output to provide said intermediate output at said d.c. level.

48. The transportable container of claim 45 in which:
said electric power conditioning assembly further comprises one or more hold-up capacitors and an inrush limit network.

49. The transportable container of claim 42 in which:
said power distribution assembly one or more a.c. couplings are configured as a.c. receptacles mounted at said drawer back.

50. The transportable container of claim 42 further comprising:
one or more local area network hubs mounted within said containment region having one or more LAN communication lines extending to LAN connectors within one or more said drawers.

51. The transportable container of claim 42 in which:
when said plurality of drawers are in said closed orientation each said drawer back is spaced inwardly from said containment region back edge periphery to provide a support region; and
said electric power conditioning assembly is located within said support region.

52. The transportable container of claim 51 in which:
said plurality of drawers are arranged when in said closed orientation in one or more generally vertically aligned stacks, each drawer back having an air entrance opening;
further comprising one or more air distribution plenums mounted at said support region, each having a plurality of air transfer outlets located for air transfer communication with a said drawer back air entrance opening when said drawer is in a closed orientation and having one or more air inlets; and
one or more fans located in air transfer relationship with said air inlets and controllable between a maximum speed and a low speed to provide air under pressure to a said one or more air distribution plenum.

53. The transportable container of claim 52 further comprising;
a temperature level sensor located adjacent a said plenum air inlet, having an output corresponding with sensed ambient air temperature levels; and
a monitor and control network responsive to current levels at said inverter input and to said temperature level sensor output to control said one or more fans.

54. The transportable container of claim 53 further comprising:
a power assemblage of light emitting diodes energizable to provide visibly perceptive cueing states:
said electric power conditioning assembly inverter exhibits a load level characteristic corresponding with said current levels at said inverter input and exhibits a maximum rated load value;
said monitor and control network is responsive in the presence of an inverter load level characteristic below said maximum rated load value to energize said power assemblage to effect a first said cueing state.

55. The transportable container of claim 54 in which:
said monitor and control network is responsive in the presence of a heat level sensor output representing a temperature greater than about 35° C. and to a load level characteristic greater than about 80% of maximum rated load value to energize said power assemblage to effect a second said cueing state.

56. The transportable container of claim 54 in which:
said monitor and control network is responsive in the presence of a heat level sensor output representing a temperature greater than about 40° C. and a load level characteristic greater than about 65% of maximum rated load value to energize said power assemblage to effect a second said cueing state.

57. The transportable container of claim 54 in which:
said monitor and control network is responsive in the presence of a heat level sensor output representing a temperature greater than about 45° C. and a load level characteristic greater than about 50% of maximum rated load value to energize said power assemblage to effect a second said cueing state.

58. The transportable container of claim 54 in which:
said monitor and control network is responsive in the presence of an inverter conditioned a.c. output greater than about 132 volts, a.c. or less than about 97 volts a.c. to energize said power assemblage to effect a third said cueing state.

59. The transportable container of claim 54 in which:
said monitor and control network is responsive in the absence of said intermediate output to energize said power assemblage to effect a fourth said cueing state.

60. The transportable container of claim 52 in which:
said electric power assembly power treatment components comprise a power supply circuit having no said intermediate output in the presence of an inhibit condition;
said inverter exhibits a load level characteristic corresponding with current levels at said intermediate output and exhibits a maximum rated load value;
further comprising:
a temperature level sensor located adjacent said plenum air inlet, having an output corresponding with sensed ambient air temperature levels; and
a monitor and control network responsive to a failed condition of a said one or more fans to derive said inhibit condition.

61. The transportable container of claim 60 in which:
said monitor and control network is responsive to a said temperature level sensor output corresponding with an air temperature level greater than about 50° C. to derive said inhibit condition.

62. The transportable container of claim 61 in which:
said monitor and control network is responsive to a said temperature level sensor output corresponding with a drop in air temperature level from greater than about 50° C. to less than about 48° C. to remove said inhibit condition.

63. The transportable container of claim 60 in which:
said monitor and control network is responsive to a said temperature level sensor output corresponding with an air temperature greater than about 45° C. in the presence of an inverter load level characteristic greater than about 75% of said maximum rated load value to derive said inhibit condition.

64. The transportable container of claim 63 in which:
said monitor and central network is responsive to a said temperature level sensor output corresponding with a drop in air temperature from greater than about 45° C. to less than about 40° C. in the presence of said inverter load level characteristic greater than about 75% to remove said inhibit condition.

65. The transportable container of claim 52 further comprising:
a temperature level sensor located adjacent a said plenum air inlet, having an output corresponding with sensed ambient air temperature levels;
said electric power conditioning assembly inverter exhibits a load level characteristic corresponding with current levels at its input and exhibits a maximum rated load value; and
further comprising a monitor and control network responsive to current levels at said inverter input and to said temperature level sensor output to vary the speed of said one or more fans within a range between maximum speed and a low speed of about 50% of said maximum speed in the presence of said ambient air temperature levels extending from about 25° C. to about 35° C.

66. The transportable container of claim 65 in which:
said monitor and control network effects said fan maximum speed in response to sensed ambient air temperature levels above about 35° C.

67. The transportable container of claim 65 in which:
said monitor and control circuit effects said fan maximum speed when said temperature level sensor output corresponds with sensed ambient air temperature levels above about 30° C. in the presence of a load level characteristic greater than about 75% of said rated load value.

68. The transportable container of claim 42 in which:
said intermediate output is at a d.c. level of about 24 volts; and
said inverter is responsive to an externally derived d.c. level power supply applied to its input in a configuration bypassing said power treatment components to provide said a.c. output.

69. The transportable container of claim 68 in which:
said externally derived d.c. level power supply is at a voltage level of about 28 volts.

70. The transportable container of claim 42 in which:
each said power distribution assembly a.c. line incorporates a resettable polymeric positive temperature coefficient overcurrent and overtemperature device.

71. The transportable container of claim 42 in which:
said electric power conditioning assembly inverter exhibits load level characteristics corresponding with current at said intermediate output and exhibits a maximum rated load value;
further comprising a bar-graph assemblage energizable to provide a sequence of four visibly perceptible cueing states;
a monitor and control network responsive to said load level characteristics to energize said bar-graph assemblage to effect a first said cueing state of said sequence in the presence of a load level characteristic representing less than about 50% of said maximum rated load value, responsive to said load level characteristics to energize said bar-graph assemblage to effect first and second said cueing states of said sequence in the presence of a load level characteristic representing greater than about 50% and less than about 70% of said maximum rated load value, responsive to said load level characteristic to energize said bar-graph assemblage to effect first, second and third said cueing states of said sequence in the presence of a load level characteristic representing greater than about 70% and less than about 90% of said maximum rated load value, and responsive in the presence of a load level characteristic representing greater than about 90% of said maximum rated load value to energize said bar graph assemblage to effect first, second, third and fourth said cueing states of said sequence.

\* \* \* \* \*